(12) United States Patent
Sadovnikov et al.

(10) Patent No.: US 12,218,190 B2
(45) Date of Patent: Feb. 4, 2025

(54) FALSE COLLECTORS AND GUARD RINGS FOR SEMICONDUCTOR DEVICES

(71) Applicant: TEXAS INSTRUMENTS INCORPORATED, Dallas, TX (US)

(72) Inventors: Alexei Sadovnikov, Sunnyvale, CA (US); Guruvayurappan S. Mathur, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 250 days.

(21) Appl. No.: 17/731,510

(22) Filed: Apr. 28, 2022

(65) Prior Publication Data

US 2023/0317775 A1 Oct. 5, 2023

Related U.S. Application Data

(63) Continuation-in-part of application No. 17/710,320, filed on Mar. 31, 2022, now Pat. No. 12,015,054.

(51) Int. Cl.
*H01L 29/06* (2006.01)
*H01L 21/762* (2006.01)
*H01L 29/78* (2006.01)

(52) U.S. Cl.
CPC .... *H01L 29/0623* (2013.01); *H01L 21/76202* (2013.01); *H01L 21/76232* (2013.01); *H01L 29/063* (2013.01); *H01L 29/7823* (2013.01)

(58) Field of Classification Search
CPC ........... H01L 29/0619; H01L 29/66234; H01L 29/73; H01L 29/735
See application file for complete search history.

(56) References Cited

U.S. PATENT DOCUMENTS

2019/0181134 A1* 6/2019 Salman ............... H01L 27/0623

* cited by examiner

*Primary Examiner* — Wasiul Haider
(74) *Attorney, Agent, or Firm* — Yudong Kim; Frank D. Cimino

(57) ABSTRACT

A method of manufacturing an integrated circuit includes forming first and second false collector regions of a first conductivity type adjacent to a surface of an epitaxial layer of semiconductor material. The first false collector region is located laterally on a first side of a base region. The base region is formed within the epitaxial layer and has a second conductivity type. The second false collector region is located laterally on a second side of the base region. The second side is opposite the first side of the base region. The base region is a base of a parasitic bipolar junction in an isolation region of an active semiconductor device.

23 Claims, 20 Drawing Sheets

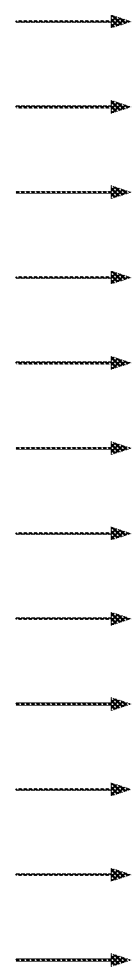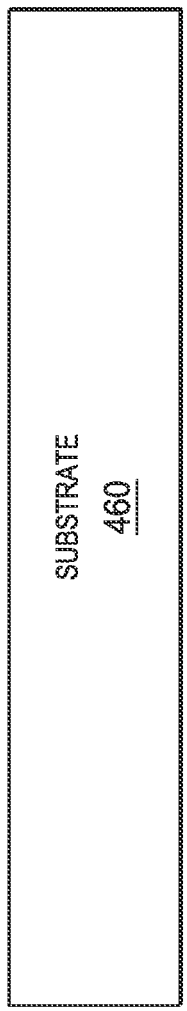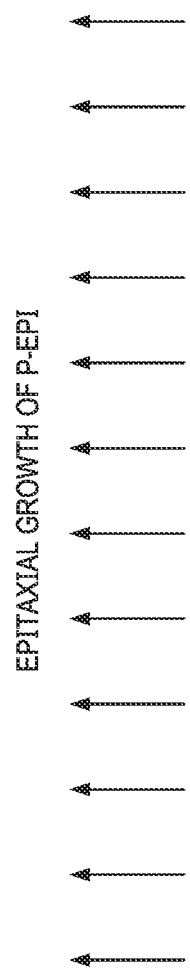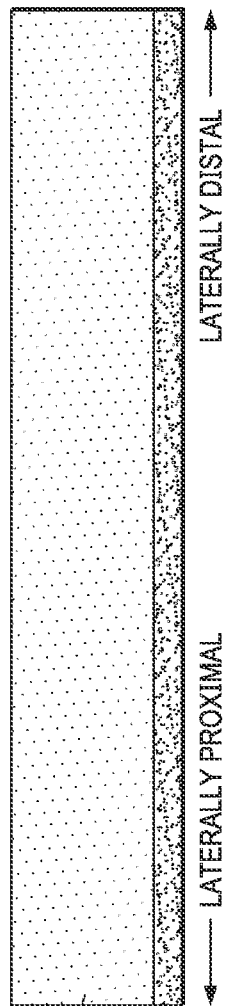
FIG. 4B
FIG. 4C

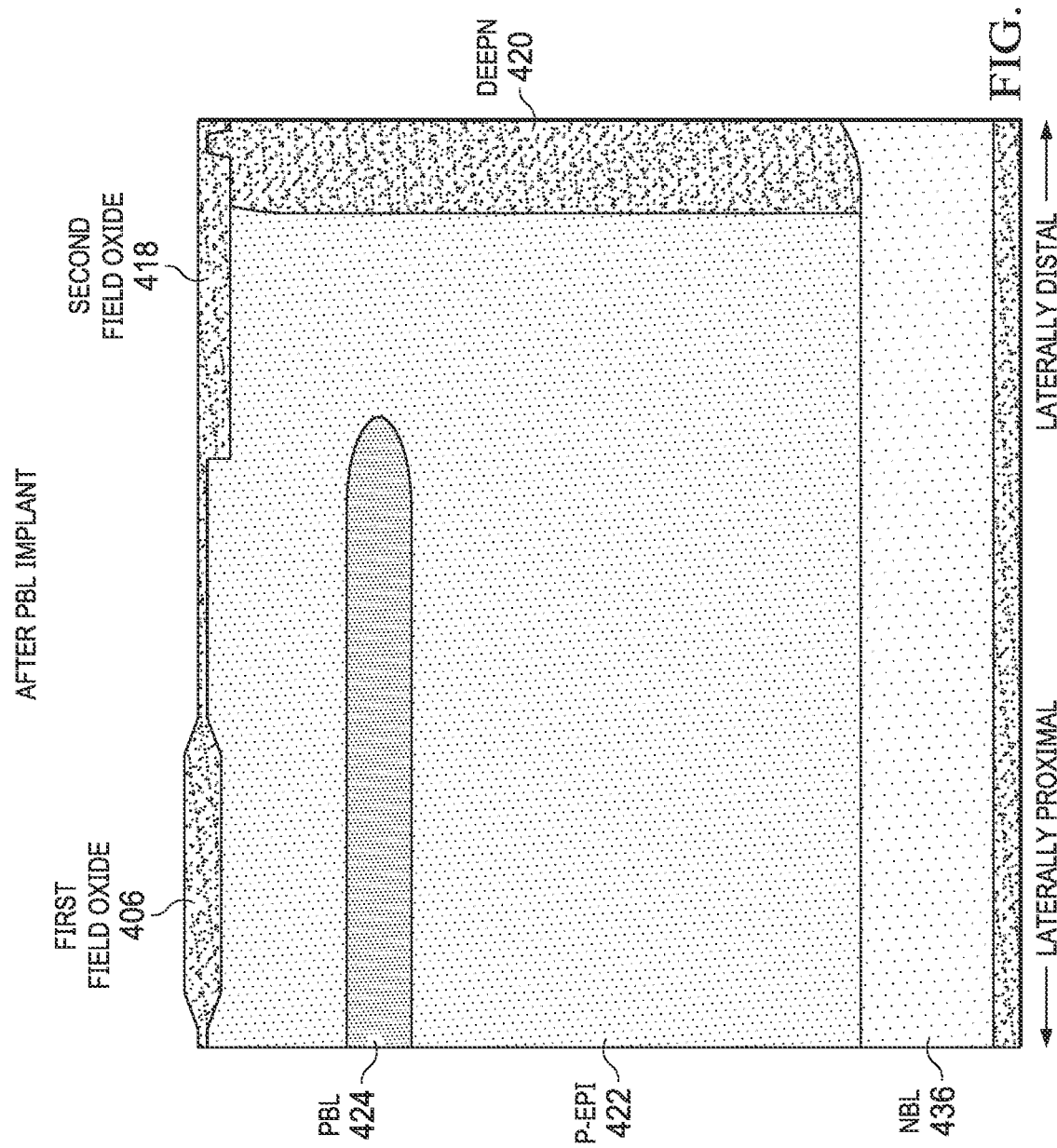

FALSE COLLECTORS AND GUARD RINGS FOR SEMICONDUCTOR DEVICES

RELATED APPLICATION

This application is a continuation-in-part of U.S. application Ser. No. 17/710,320, which was filed Mar. 31, 2022, and is incorporated herein by reference in its entirety.

TECHNICAL FIELD

This description relates generally to semiconductor device fabrication, and more particularly to isolation regions having false collectors and guard rings for semiconductor devices.

BACKGROUND

Power field effect transistors (FETs), such as lateral-diffused metal-oxide-semiconductor (LDMOS) devices, can be used in applications such as DC-DC power converters. In an LDMOS device, a drain is laterally arranged to allow current to laterally flow, and a drift region is interposed between the channel and the drain to provide a high drain-to-source breakdown voltage. Conventional power LDMOS devices are n-channel devices that employ p-type body regions. Some of the body doping generally comes from the p-type epitaxial silicon, which has essentially uniform boron doping. Additional p-type body doping can come from a high energy (near-MeV or MeV) p-type (e.g., boron) buried layer (PBL) implant.

The open-base collector-emitter breakdown voltage $BV_{CEO}$ (sometimes written $V_{CEO}$ or $V_{(BR)CEO}$) of a semiconductor device is the maximum voltage between a collector of the semiconductor device and an emitter of the semiconductor device that can be applied, when no circuit is coupled at the base of the transistor to remove collector-base leakage, and when the collector is biased in the reverse direction with respect to the emitter, without causing breakdown between the collector and the emitter. The collector is biased in the reverse direction when the collector is made positive, for NPN semiconductor devices, or negative, for PNP semiconductor devices, with respect to the emitter.

SUMMARY

An example method of manufacturing an integrated circuit includes forming first and second false collector regions of a first conductivity type adjacent to a surface of an epitaxial layer of semiconductor material. The first false collector region is located laterally on a first side of a base region. The base region is formed within the epitaxial layer and has a second conductivity type. The second false collector region is located laterally on a second side of the base region. The second side is opposite the first side of the base region. The base region is a base of a parasitic bipolar junction in an isolation region of an active semiconductor device.

An example integrated circuit includes first and second active semiconductor devices in a substrate and a lateral isolation region configured to isolate the first active semiconductor device from the second active semiconductor device. The lateral isolation region includes first and second doped regions having a first conductivity type. The first and second doped regions are located adjacent to a surface of the lateral isolation region. The second doped region is located laterally further away from the given active semiconductor device than the first doped region. The lateral isolation region further includes a third doped region laterally located between the first and second doped regions and adjacent to the surface of the lateral isolation region. The third doped region is of a second conductivity type opposite to the first conductivity type. The first, third, and second doped regions respectively form a collector, a base, and an emitter of a parasitic bipolar junction of the lateral isolation region. The lateral isolation region further includes first and second false collector regions of the first conductivity type. The first false collector region is located laterally between the collector and the base. The second false collector region is located laterally between the base and the emitter.

An example method of fabricating an integrated circuit includes implanting and driving-in a dopant of a first conductivity type into a semiconductor substrate to form a first buried layer. An epitaxial layer of a second conductivity type, opposite the first conductivity type, is formed over the first buried layer. A deep trench isolation sidewall of the first conductivity type is formed above the semiconductor substrate. An oxide layer is formed over the epitaxial layer. A dopant of the second conductivity type is implanted into the epitaxial layer to form a second buried layer. A dopant of the second conductivity type is implanted into the epitaxial layer above the second buried layer to form a deep region that is adjacent to the second buried layer and between the oxide layer and the second buried layer. A dopant of the first conductivity type is implanted into the epitaxial layer above the second buried layer to form a collector region. The collector region is located laterally from the deep region and extending from the surface of the epitaxial layer to terminate at a location spaced from the second buried layer. A dopant of the second conductivity type is implanted into the epitaxial layer above the second buried layer to form first, second, and third shallow well regions, the third shallow well region located laterally between the first and second shallow well regions, the third shallow well region formed over the deep region. A dopant of the first conductivity type is implanted into the epitaxial layer to form first and second false collector regions adjacent to the surface of the epitaxial layer. The first false collector region is located laterally between the first shallow well region and the third shallow well region. The second false collector region is located laterally between the third shallow well region and the second shallow well region. A dopant of the second conductivity type is implanted into the epitaxial layer to form a base region extending between the third shallow well region and the surface of the epitaxial layer. The base region forms a base of a bipolar junction of a lateral isolation region. The collector region forms a collector of the bipolar junction. The deep trench isolation sidewall forms an emitter of the bipolar junction.

BRIEF DESCRIPTION OF THE DRAWINGS

FIGS. 4B through 4G are cross-sectional views of the portion of the example lateral isolation region of FIG. 4A, showing the isolation region portion at different stages of fabrication.

DETAILED DESCRIPTION

Figure 1:
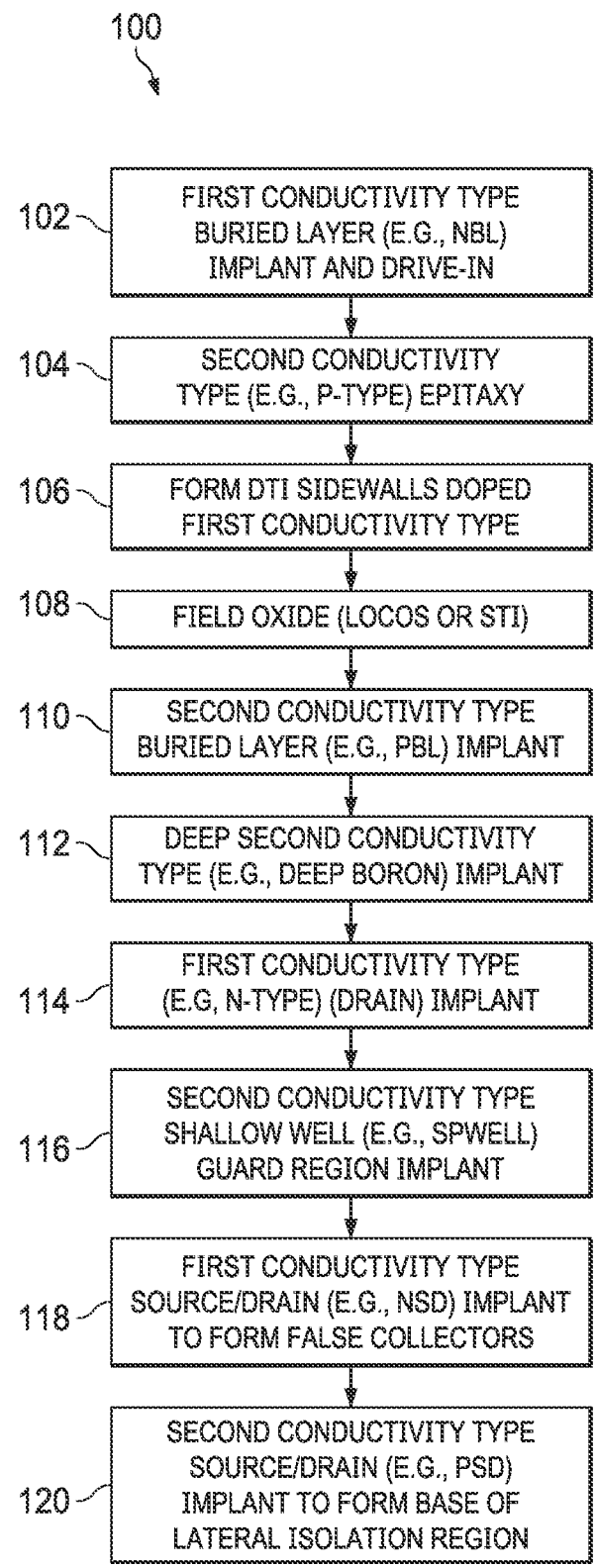
FIG. 1 is a flow chart showing an example method of fabricating a lateral isolation region for an active semiconductor device that includes false collectors and, in some examples, guard rings.

An active semiconductor device (e.g., a diode, an NPN bipolar junction transistor (BJT), or an n-channel LDMOS (NLDMOS) field-effect transistor (FET)) can fabricated on a wafer and can be surrounded, in a top-down view of the wafer, by a lateral isolation region that spatially and electrically separates the active semiconductor device from one or more other active semiconductor devices fabricated on the wafer. The lateral isolation region can, for example, be formed by various implants within an epitaxial layer on a substrate, such as a p-type epitaxial (p-epi) layer in the case where the lateral isolation region surrounds an NLDMOS transistor. These lateral isolation region implants can form sub-regions of the lateral isolation region that can have the appearance of concentric rings around the active semiconductor device in the top-down view. The concentric rings of the lateral isolation subregions can be circular or have other shapes (e.g., elliptical, rectangular or the like).

The lateral isolation region of the active semiconductor device can itself act as a parasitic bipolar junction having a collector, a base, and an emitter laterally spaced at respective locations from a side of the active semiconductor device. In an example, the laterally medial base is located between the collector and the emitter, and the laterally proximal collector is located nearest to the active semiconductor device. Thus, in this example, the laterally distal emitter is spaced laterally from the active semiconductor device further than the base, and the base is spaced laterally from the active semiconductor device further than the collector. For example, if the sub-regions of the lateral isolation region form a p-type region between two n-type regions, a parasitic NPN bipolar junction is formed by the p-type region between the two n-type regions. Such a lateral NPN isolation region can include, for example, an n-type drift (NDRIFT) region and deep n-type diffusion (DEEPN diffusion) region. A region referred to as a "deep" region is a region that is deeper than a region referred to as a "shallow" region. The deep n-type diffusion region may be part of a DEEPN ring, on either side of a p-type doped region of the p-epi. Such a lateral NPN isolation region can have a much larger common emitter mode current gain $H_{fe}$ than an NPN bipolar junction formed by vertical isolation features, such as may include the NDRIFT region, a p-type buried layer (PBL) (e.g., a p-type reduced surface field (PRESURF) region) in the p-epi, and an n-type buried layer (NBL) beneath the PBL. The open-base collector-emitter breakdown voltage $BV_{CEO}$ of the lateral NPN isolation region (its "bipolar breakdown" voltage) can be much smaller than its open-emitter collector-base breakdown voltage $BV_{CBO}$ (its "junction breakdown" voltage). In the case of high impedance ("open") connection to the base of this lateral parasitic NPN, the open-base collector-emitter breakdown voltage $BV_{CEO}$, not the open-emitter collector-base breakdown voltage $BV_{CBO}$, defines the maximum isolation voltage.

If an electrical contact coupled to the base of the parasitic bipolar junction (e.g., the p-type doped ring between two n-type rings, in the parasitic NPN example) is grounded or is otherwise coupled to a circuit that can remove collector-base leakage, the voltage rating of a lateral isolation region is limited by the shorted-base collector-emitter breakdown voltage $BV_{CES}$ (the "junction pinch-through" voltage) of parasitic bipolar junction. If, however, this base contact of the parasitic bipolar junction is coupled to a voltage source, or to ground, through a high-impedance circuit (e.g., a large resistor or resistive network, or a large inductor or inductive network during transient conditions), or is left floating (unconnected), then, due to bipolar action, breakdown happens at the much lower open-base collector-emitter breakdown voltage $BV_{CEO}$. For example, the open-base collector-emitter breakdown voltage $BV_{CEO}$ is about equal to $BV_{CES}/\{H_{fe}\}^{\wedge}(0.2\text{-}0.3)$, where "0.2-0.3" represents an approximate range of possible values of the exponent. In some applications, reduction of the common emitter mode current gain $H_{fe}$ using higher-concentration doping, for example, by adding a deep, high-concentration p-type layer to the isolation region in the case of an NPN parasitic junction, is not possible or not desirable.

Common emitter mode current gain $H_{fe}$ can be reduced by surrounding the base contact of the parasitic bipolar junction with "false collector" regions of a conductivity type opposite that of the base, and that are shorted to the base. Thus, in an NPN parasitic junction, in which the parasitic bipolar junction base is a p-type region, these false collector regions can be n-type, and can be shorted to the p-type region of the parasitic bipolar junction base. For example, the false collector regions can include a first false collector ring that is laterally more distant from an active semiconductor device than a collector region (e.g., an NDRIFT region in an NPN isolation example) and laterally closer to the active semiconductor device than a base region (e.g., a p-type source/drain (PSD) region in the NPN isolation example). The false collector regions can also include a second false collector ring that is laterally more distant from the active semiconductor device than the base region (e.g., the PSD region) and laterally nearer to the active semiconductor device than an emitter region (e.g., a DEEPN region in the NPN isolation example). The false collectors can collect a significant portion of injected carriers (e.g., electrons) that otherwise would reach the lateral isolation collector (e.g., the NDRIFT region) from the lateral isolation base.

Guard rings of the same conductivity type as the base of the lateral isolation region (e.g., p-type in the NPN isolation example) can be provided as shallow regions between the false collectors and the collector and emitter regions of the lateral isolation region to prevent surface leakage ("punch-through"). For example, the guard rings can include a first guard ring between the lateral isolation collector and the first false collector, and a second guard ring between the second false collector and the lateral isolation emitter. A region referred to as a "shallow" region is a region that is shallower than a region referred to as a "deep" region.

FIG. 1 is a flow chart illustrating an example method 100 of fabricating a lateral isolation region for an active semiconductor device that includes false collectors and, in some examples, guard rings. Method 100 can be performed, for example, as part of a larger process of forming a plurality of circuit elements (e.g., one or more LDMOS devices) on a semiconductor circuit wafer. Accordingly, apart from the actions illustrated in FIG. 1 and described below, method 100 can further include a number of actions, such as various other epitaxial growth, mask, etch, implant, and anneal actions, that are not specifically shown or described herein.

A first buried layer can be formed in a wafer substrate, at 102, by, for example, implanting and driving into (diffusing into) the wafer substrate a dopant of a first conductivity type. Examples of this buried layer are illustrated as n-type buried layer (NBL) 336 in FIG. 3 and NBL 436 in FIG. 4A. FIG. 4B shows an example of implantation and drive-in of n-type ions into substrate 460 to form buried layer NBL 436 (shown in FIGS. 4A and 4C). The n-type dopant can be, e.g., phosphorus or arsenic. The wafer substrate 460 can be configured, for example, of a semiconductor substrate formed of single-crystal silicon lightly doped with dopants of a second conductivity type opposite the first conductivity type (e.g., p-type). For example, the semiconductor substrate is formed by epitaxial growth. The drive-in can be accomplished, for example, using a high-temperature anneal process. The dopant concentration of the dopant of the first conductivity type in the buried layer can be, for example, between about $1\times10^{18}$ ions/cm$^3$ and about $1\times10^{20}$ ions/cm$^3$.

An epitaxial layer of the second conductivity type (e.g., a p-type semiconductor layer p-epi) can be formed, at 104, on the semiconductor substrate over the first buried layer. FIG. 4C illustrates an example epitaxial layer growth to form the p-epi layer 422 shown in FIGS. 4A and 4D. The concentration of the dopant of the second conductivity type within the epitaxial layer can be, for example, between about $1\times10^{15}$ ions/cm$^3$ and about $1\times10^{16}$ ions/cm$^3$. The epitaxial layer can be grown, for example, to a thickness (depth) of between about 5 micrometers and about 20 micrometers. Examples of this epitaxial layer are illustrated as p-epi 322 in FIG. 3, p-epi 422 in FIG. 4A, and p-epi 522 in FIG. 5A.

Figure 4A:
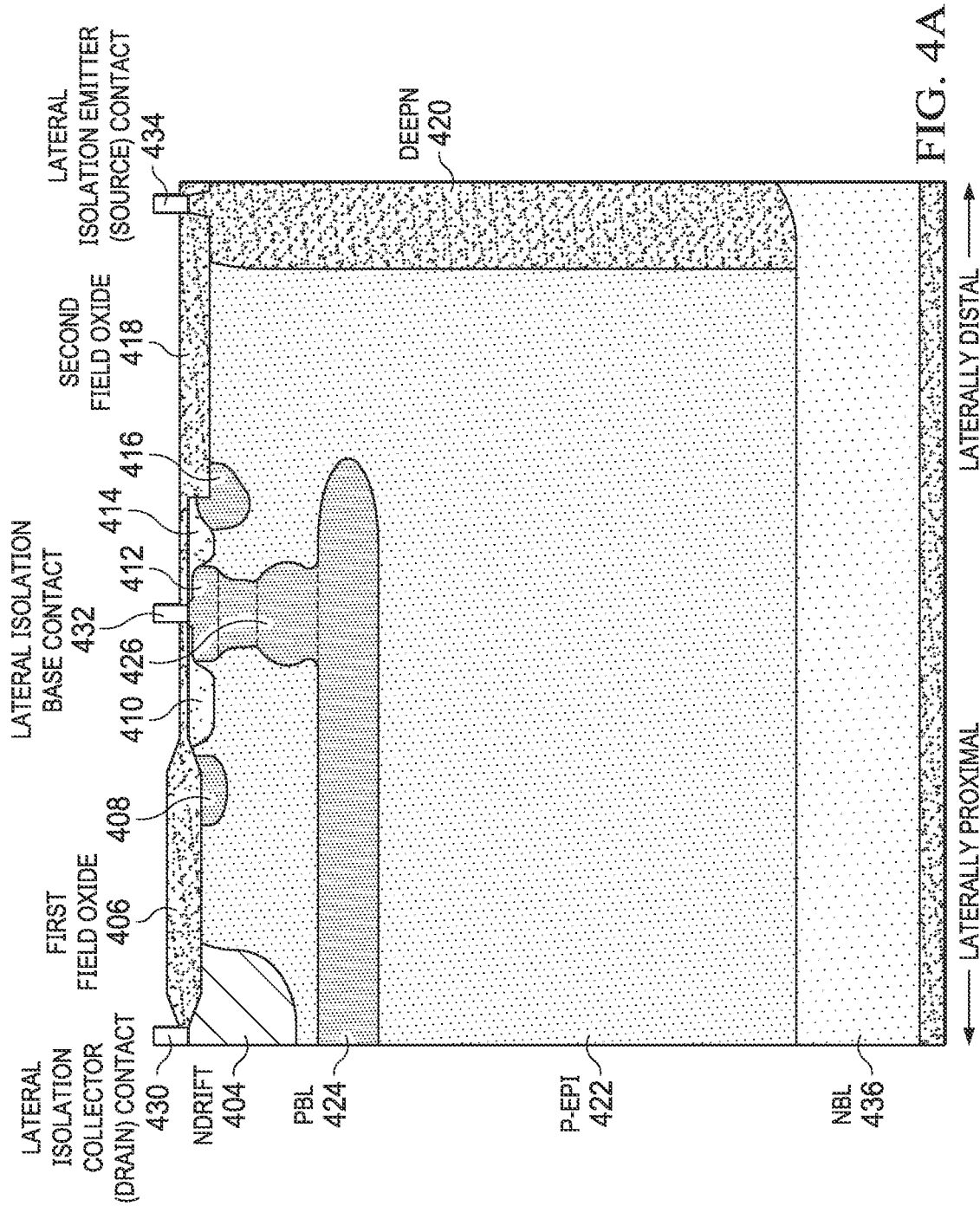
FIG. 4A is a cross-sectional view of a portion of an example lateral isolation region, corresponding to the section line 4 of the top-down view of FIG. 2 and also to isolation region 344 of the cross-sectional view of FIG. 3.
Figure 4D:
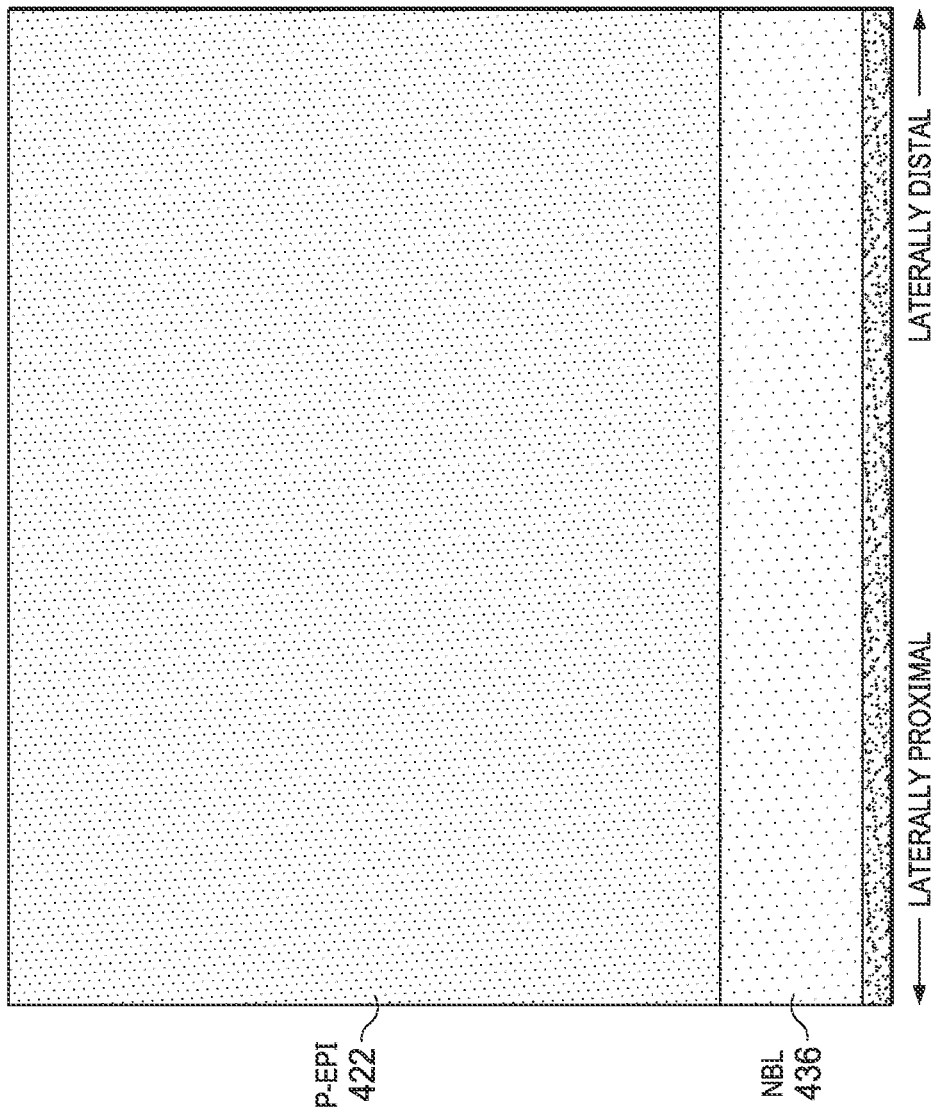
Figure 4E:
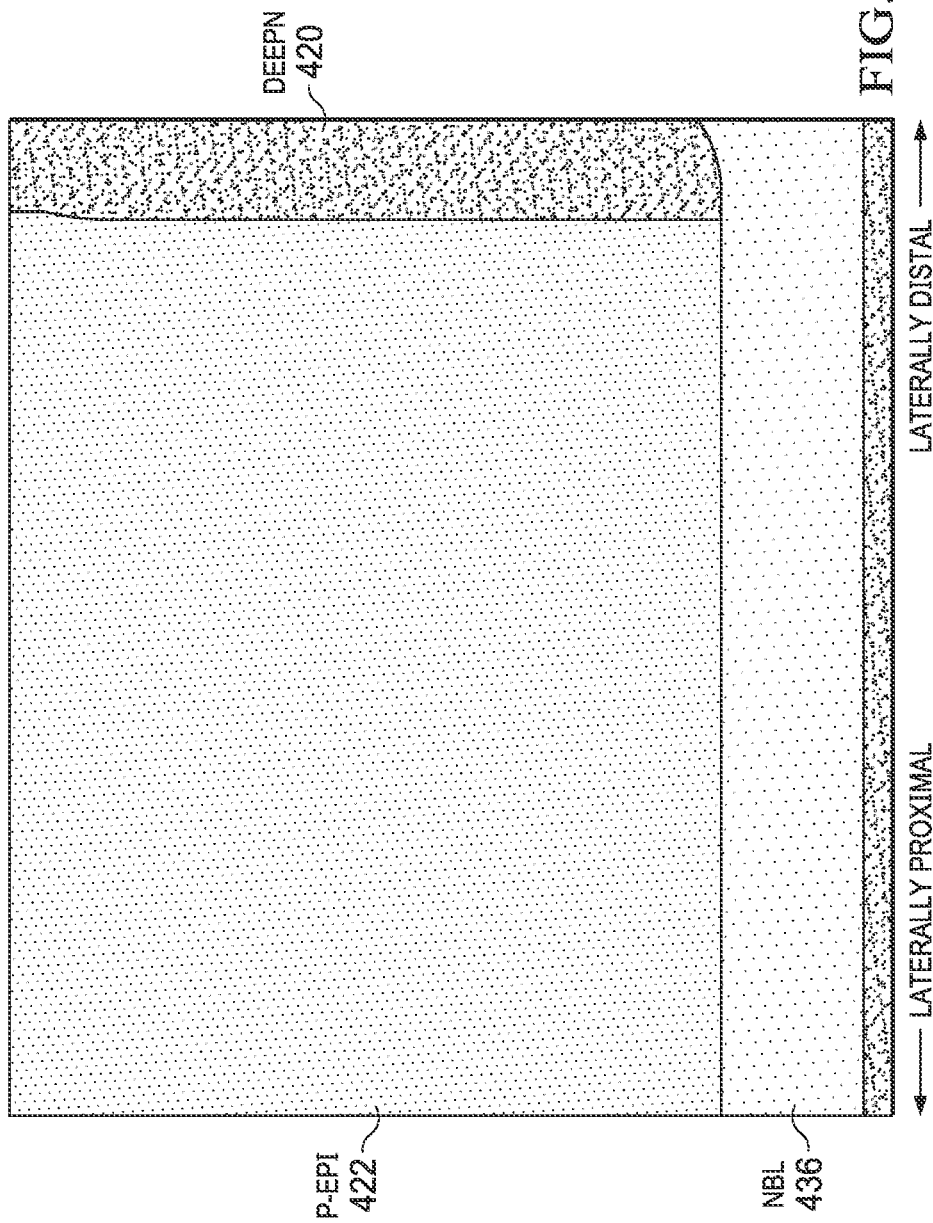

A deep trench isolation (DTI) process can be performed, at 106, to form sidewalls doped with dopant of the first conductivity type. The DTI forms one or more trenches that extend from the surface of the epitaxial layer to at least the buried layer. FIG. 4E shows the structure portion of FIG. 4D after the formation and doping of the sidewalls. The DTI can be performed in a number of ways. An example DTI formation is illustrated in the zoomed-out views of FIGS. 6A-6D, which views can sequentially come between FIGS. 4D and 4E in the fabrication process. FIG. 6A shows the n-type buried layer 636 (corresponding to NBL 436 of FIGS. 4A and 4C-4G) in substrate 660 (corresponding to substrate 460 of FIG. 4B). FIG. 6A further shows p-type epitaxial layer 622 (corresponding to p-epi 422 of FIGS. 4A and 4D-4G) formed over the NBL 636 and substrate 660. The DTI sidewall formation process can include, for example, forming a lithographic mask over the p-epi 622 and etching away of the p-epi 622 down to the first buried layer NBL 636 in unmasked regions to form a deep trench 650 and thereby to expose sidewalls 652, as shown in FIG. 6B. The DTI etch can be performed, e.g., to a depth of between about 10 micrometers and 30 micrometers. The DTI sidewall formation process can continue, for example, by tilted implantation of the dopant of the first conductivity type, which can be, e.g., phosphorus, into the exposed sidewalls 652 to form the DEEPN 620 region shown in FIG. 6C, corresponding to the DEEPN 420 region shown in FIG. 4A and FIG. 4E. The tilted sidewall implantation can be followed by an anneal to diffuse the sidewall dopant into the sidewall. The concentration of the dopant of the first conductivity type implanted into the sidewalls can be, for example, between about $1\times10^{18}$ ions/cm$^3$ and about $1\times10^{19}$ ions/cm$^3$. Examples of this doped DTI sidewall are illustrated as DEEPN 220 in FIG. 2, DEEPN 420 in FIG. 4A, and DEEPN 520 in FIG. 5A. FIG. 6D shows that the deep trench 650 can subsequently be lined with a conformal insulator layer 654 and filled with a conductive fill 656. The conformal insulator layer 654 can comprise, for example, a relatively thin layer of an oxide material, a nitride material, an oxynitride material, and/or a high-k dielectric material. The conductive fill 656 can be formed on top of the conformal insulator layer 654 and can comprise, for example, a polysilicon or amorphous silicon material doped with sufficient quantities of a selected dopant in order to achieve a desired level of conductivity. Alternatively, the conductive fill 656 can comprise any other suitable conductor (e.g., a conductive metal or metal alloy).

Figure 4F:
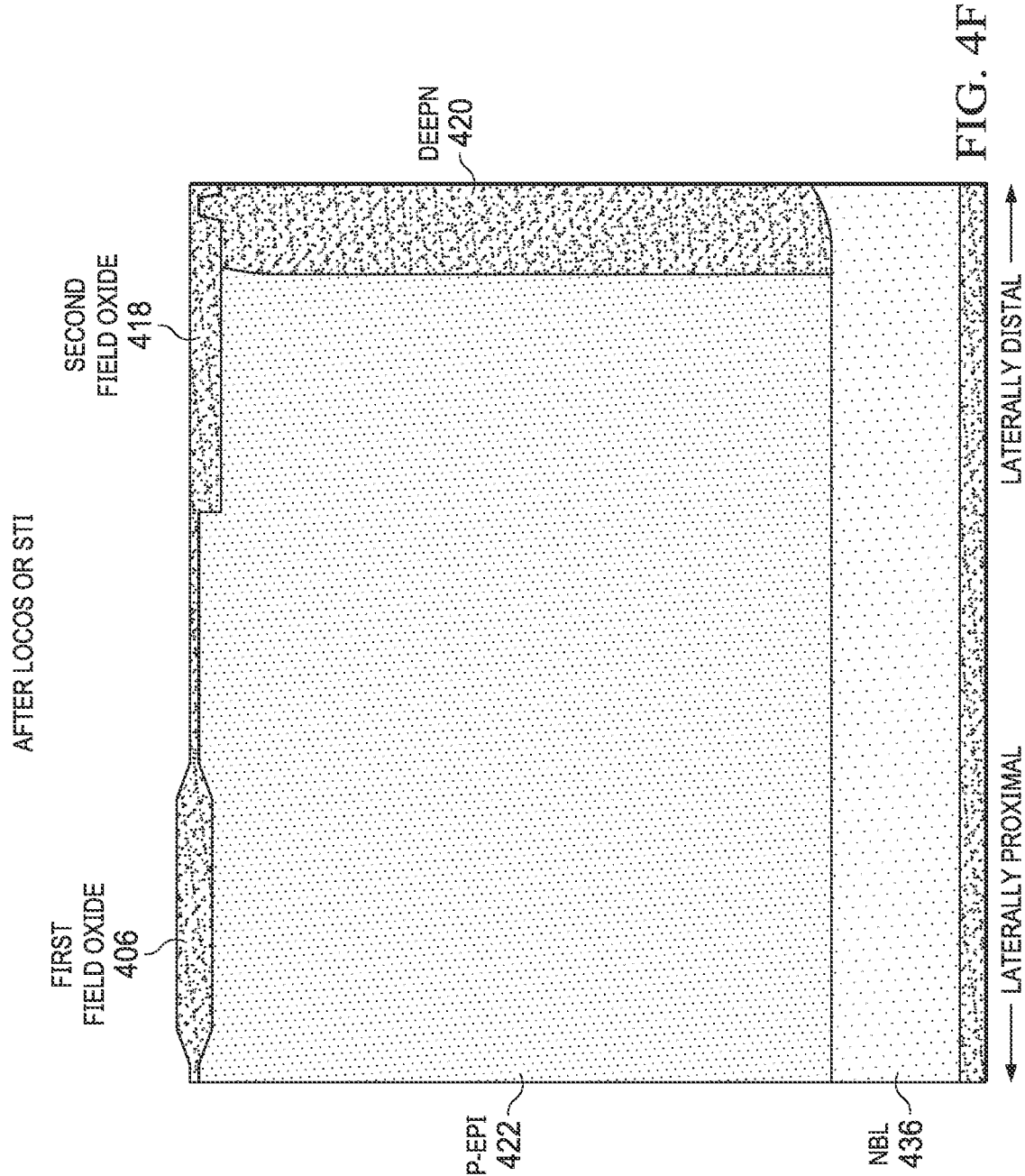

Following the formation of the DEEPN 420 region shown in FIG. 4E, a field oxide layer can be formed, at 108, over the epitaxial layer using either local oxidation of silicon (LOCOS) or shallow trench isolation (STI) processes. FIG. 4F illustrates an example oxide layer having oxide regions 406, 418 formed on top of p-epi 422, following from the epitaxial growth, DTI, and sidewall implantation of FIGS. 4C-4E. The field oxide layer can, for example, be formed at a thickness (depth) of between about 0.3 micrometers and about 1.0 micrometer. Examples of this field oxide layer are illustrated as field oxide rings 206 and 218 in FIG. 2, first and second field oxide regions 406 and 418 in FIG. 4A, and first and second field oxide regions 506 and 518 in FIG. 5A.

A second buried layer can be formed in the epitaxial layer, at 110, by implanting into the epitaxial layer a dopant of the second conductivity type. The second buried layer can be, e.g., a PBL, in which example the second conductivity type is p-type and the dopant of the second conductivity type used to form the PBL can be, e.g., boron. Following from the oxide layer formation shown in FIG. 4F, FIG. 4G illustrates an example second buried layer PBL 424 formed in p-epi 422. As an example, the second buried layer can have a concentration of dopant of the second conductivity type of between about $1\times10^{16}$ ions/cm$^3$ and about $1\times10^{18}$ ions/cm$^3$. The second buried layer can form, for example, a reduced surface field (RESURF) region (e.g., a PRSRF region). FIG. 5B shows a zoomed-in view of the example of FIG. 4G, in which the second buried layer is PRSRF region 524. Examples of the second buried layer formed by implantation 110 are illustrated as PBL 324 in FIG. 3, PBL 424 in FIG. 4A, and PRSRF 524 in FIG. 5A.

A relatively deep implantation, at 112, of a dopant of the second conductivity type (e.g., a DEEP boron implant) can be performed in the epitaxial layer. This implant can provide a deep region (shaped, e.g., as a laterally oriented ring) that extends upward from the buried layer of the second conductivity type. Following from the second buried layer implantation, the result of which is shown in FIGS. 4G and 5B, FIG. 5C illustrates an example DEEP boron region 526 formed in p-epi 522. The ring of the deep region can have, for example, a concentration of the dopant of the second conductivity type of between about $1\times10^{16}$ ions/cm$^3$ and about $1\times10^{18}$ ions/cm$^3$. Examples of regions provided by implantation 112 are illustrated as DEEP boron region 426 in FIG. 4A and DEEP boron region 526 in FIG. 5A.

An implantation, at 114, of a dopant of the first conductivity type (e.g., n-type) can be provided in the epitaxial layer to form a drain region. The implanted drain region can, later in the fabrication process, be electrically coupled to a lateral isolation collector contact, such as contact 430 in FIG. 4A or contact 530 in FIG. 5A. Following from the deep region implantation, an example result of which is shown in FIG. 5C, FIG. 5D illustrates an example drain region NDRIFT 504 formed in p-epi 522. The dopant of the first conductivity type implanted at 114 can be, e.g., arsenic or phosphorus. Implantation 114 can provide a region (e.g., a laterally oriented ring) having, for example, a concentration of the dopant of the first conductivity type of between about $1 \times 10^{16}$ ions/cm$^3$ and about $1 \times 10^{20}$ ions/cm$^3$. Examples of regions provided by implantation 114 are illustrated as n-type ring 204 in FIG. 2, NDRIFT region 404 in FIG. 4A, and NDRIFT region 504 in FIG. 5A.

An implantation, at 116, of dopant of the second conductivity type (e.g., p-type) can be provided in the epitaxial layer to form one or more shallow well regions (e.g., shallow p-well (SPWELL) regions). The one or more shallow well regions can include a region that is adjacent to and extends upward from the region created by the implant at 112 of method 100, and that can, for example, be arranged as a laterally oriented ring. The one or more shallow well regions can, in some examples, further include guard regions that can be arranged as laterally oriented guard rings. The region that is adjacent to and extends upward from the region created by the implant at 112 can be laterally located between the guard regions, if any. The dopant of the second conductivity type implanted at 116 can be, e.g., boron. Following from the drain region implant, an example result of which is shown in FIG. 5D, FIG. 5E illustrates example shallow well regions SPWELL1 508, SPWELL2 516, and SPWELL 528 formed in p-epi 522. Implantation 116 can provide shallow well regions of a concentration of dopant of the second conductivity type of between about $1 \times 10^{16}$ ions/cm$^3$ and about $1 \times 10^{18}$ ions/cm$^3$. Examples of regions provided by implantation 116 are illustrated as first and second p-type guard rings 208 and 216 in FIG. 2, SPWELL1 408 and SPWELL2 416 in FIG. 4A, and SPWELL 528, SPWELL1 508, and SPWELL2 516 in FIG. 5A.

An implantation, at 118, of dopant of the first conductivity type (e.g., n-type) can be provided in the epitaxial layer to form first conductivity type source/drain (e.g., NSD) regions that form false collectors. The dopant of the first conductivity type implanted at 118 can be, e.g., arsenic or phosphorus. Following from the shallow well region implant, an example result of which is shown in FIG. 5E, FIG. 5F illustrates example first conductivity type source/drain regions NSD1 510 and NSD2 514 formed in p-epi 522. Implantation 118 can provide first conductivity type source/drain regions of a concentration of dopant of the first conductivity type of between about $1 \times 10^{19}$ ions/cm$^3$ and about $1 \times 10^{20}$ ions/cm$^3$. Examples of regions provided by implantation 118 are illustrated as first and second NSD rings 210 and 214 in FIG. 2, NSD1 410 and NSD2 414 in FIG. 4A, and NSD1 510 and NSD2 514 in FIG. 5A.

An implantation, at 120, of dopant of the second conductivity type (e.g., p-type) can be provided in the epitaxial layer to form a source/drain (e.g., PSD) region that can have the form of a laterally oriented ring and that can, later in the fabrication process, be electrically coupled to a lateral isolation base contact, such as contact 432 in FIG. 4A or contact 532 in FIG. 5A. The dopant of the second conductivity type implanted at 120 can be, e.g., boron. Following from the first conductivity type source/drain implant, an example result of which is shown in FIG. 5F, FIG. 5G illustrates example second conductivity type source/drain region PSD1 512 formed in p-epi 522. Implantation 120 can provide the source/drain region of a concentration of dopant of the second conductivity type of between about $1 \times 10^{19}$ ions/cm$^3$ and about $1 \times 10^{20}$ ions/cm$^3$. Examples of the region provided by implantation 120 are illustrated as PSD rings 212 in FIG. 2, PSD 412 in FIG. 4A, and PSD 512 in FIG. 5A.

Figure 2:
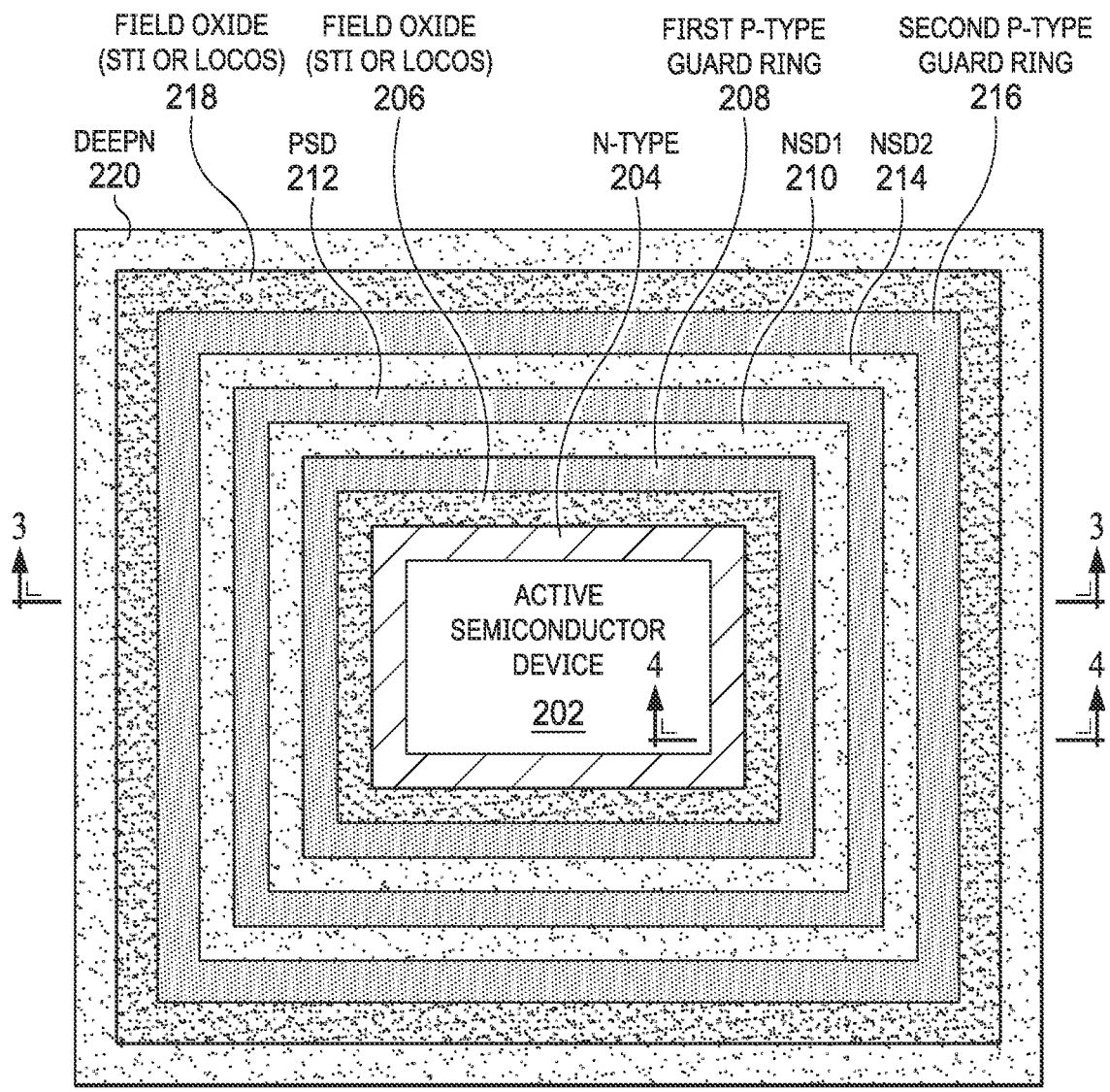
FIG. 2 is a top-down schematic view of an example annular lateral isolation region including rings surrounding an active semiconductor device.

FIG. 2 is a top-down schematic view of an example annular lateral isolation region including rings 204-220 surrounding an active semiconductor device 202. The active semiconductor device 202 can be, as examples, an LDMOS transistor, a diode, or an NPN bipolar transistor. The lateral isolation rings can be formed by a fabrication method such as method 100 described above with regard to FIG. 1. FIG. 2 is not necessarily to scale. FIG. 2 provides an NPN example of the lateral isolation configuration, but a PNP example, having rings of conductivity types opposite of what is shown in FIGS. 2 through 5G, is also possible. The rings are shown in the example of FIG. 2 as being rectangular in shape, but in other examples, can be square, circular, oval, or of other shapes. In other examples, not illustrated, the isolation region is not annular, but incompletely surrounds the active semiconductor device 202. As an example, the isolation region may be provided on only one, two, or three sides of the active semiconductor device 202, in a top-down view.

The principal NPN bipolar junction of the annular isolation region that surrounds active semiconductor device 202 in FIG. 2 is provided by inner n-type ring 204, medial PSD ring 212, and outer DEEPN ring 220. The inner n-type ring 204 can be conductively coupled to a lateral isolation collector contact, such as contact 430 shown in FIG. 4A or contact 530 shown in FIG. 5A, and can, for example, be coupled to a source of comparatively high voltage. The medial PSD ring 212 can be conductively coupled to a lateral isolation base contact, such as contact 432 shown in FIG. 4A or contact 532 shown in FIG. 5A, and can, for example, be left floating (unconnected) or coupled to a voltage source, or to ground, through a high-impedance circuit. The outer DEEPN ring 220 can be conductively coupled to a lateral isolation emitter contact, such as contact 434 shown in FIG. 4A or contact 534 shown in FIG. 5A, and can, for example, be coupled to ground or a comparatively low voltage.

Inner and outer false collector rings NSD1 210 and NSD2 214 in FIG. 2 radially surround the PSD ring 212 and are located so as to collect a significant portion of injected carriers (e.g., electrons) that otherwise would reach inner n-type ring 204 (the parasitic bipolar junction collector) from the PSD ring 212 (the parasitic bipolar junction base), thus lowering the common emitter mode current gain $H_{fe}$ of the parasitic bipolar junction formed by n-type ring 204, PSD ring 212, and DEEPN ring 220. First p-type guard ring 208 is located laterally nearer to the active semiconductor device 202 than the inner false collector NSD1 210 and laterally further from the active semiconductor device 202 than inner n-type ring 204 (the parasitic bipolar junction collector). Second p-type guard ring 216 is located laterally further from the active semiconductor device 202 than outer false collector NSD 214 and laterally nearer to the active semiconductor device 202 than outer DEEPN ring 220 (the parasitic bipolar junction emitter). The guard rings 208, 216 are located so as to prevent surface leakage ("punchthrough") between the false collectors 210, 214 and the collector and emitter regions 204, 220 of the annular lateral isolation region.

As shown in the cross-sectional views of FIGS. 3-5G, a layer of field oxide (such as can be formed at 108 of method 100 of FIG. 1) can substantially cover the lateral isolation region composed of rings 204-220, and can have comparatively greater thickness in concentric portions of the lateral isolation region between n-type ring 204 and PSD ring 212, and between PSD ring 212, and DEEPN ring 220, and comparatively lesser thickness in the concentric region surrounding PSD ring 212. The concentric portions of field oxide of greater thickness are represented in the schematic diagram of FIG. 2 as inner field oxide ring 206 and outer field oxide ring 218. In a cross-sectional view, inner field oxide ring 206 can be partially or completely over n-type ring 204 and/or first p-type guard ring 208, and outer field oxide ring 218 can be partially or completely over second p-type guard ring 216 and/or DEEPN ring 220. Thus, the rings 204-220 of the lateral isolation region schematically depicted in FIG. 2 do not necessarily exclusively occupy the respective concentric spaces as illustrated in FIG. 2, but can have some overlap with each other in a top-down view.

Figure 3:
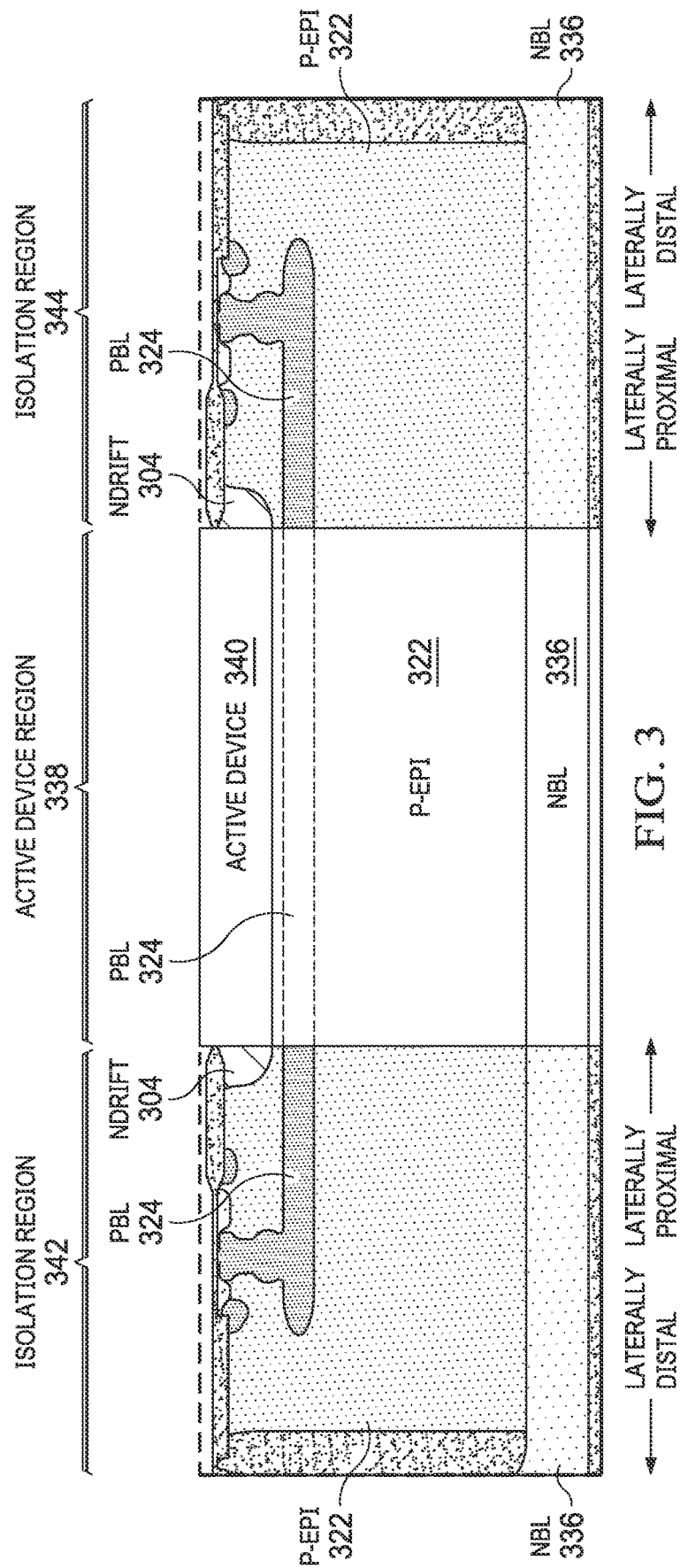
FIG. 3 is a cross-sectional view of an example laterally isolated active semiconductor device, corresponding to the section line 3 of the top-down view of FIG. 2.

FIG. 3 is a cross-sectional view of an example laterally isolated active semiconductor device, corresponding to the section line 3 of the top-down view of FIG. 2. In the cross-sectional view of FIG. 3, an active device region 338 containing active device 340 is located between isolation regions 342, 344, which are mirror images of each other. The features of isolation region 342 may be continuous with those of isolation region 344 in three-dimensional space. The active semiconductor device 340 can be, as examples, an LDMOS transistor, a diode, or an NPN bipolar transistor. Vertical isolation is provided for active device 340 by NDRIFT region 304 and PBL region 324 in p-epi layer 322 and NBL 336. Lateral isolation is provided for active device 340 by features of isolation regions 342, 344 that are more visible in, and will be described in greater detail with regard to, the zoomed-in views of FIGS. 4A and 5A.

FIG. 4A is a cross-sectional view of a portion of an example lateral isolation region, corresponding to the section line 4 of the top-down view of FIG. 2 and also to isolation region 344 of the cross-sectional view of FIG. 3. In the illustrated example, an NPN junction is formed by n-type regions NDRIFT 404 and DEEPN 420, separated by p-type region p-epi 422, which includes PBL 424, DEEP boron region 426, and PSD 412, which are likewise all p-type. Lateral isolation collector contact 430 is conductively coupled to NDRIFT 404, which can correspond to n-type ring 204 in the schematic diagram of FIG. 2. Lateral isolation base contact 432 is conductively coupled to PSD 412, which can correspond to PSD 212 of FIG. 2. Lateral isolation emitter contact 434 is conductively coupled to DEEPN 420, which can correspond to DEEPN 220 of FIG. 2.

The top surface of the lateral isolation region shown in FIG. 4A is coated with a field oxide layer that includes first and second field oxide regions 406, 418, which can respectively correspond to field oxide rings 206, 218 in the schematic diagram of FIG. 2. First and second n-type false collectors 410, 414, which can correspond to NSD1 210 and NSD2 214 of FIG. 2, are located so as to collect a significant portion of injected carriers (e.g., electrons) that otherwise would reach NDRIFT 404 (the parasitic bipolar junction collector) from PSD 412 (the parasitic bipolar junction base), thus lowering the common emitter mode current gain $H_{fe}$ of the parasitic bipolar junction formed by NDRIFT 404, PSD 412, and DEEPN 420. First and second SPWELL regions 408, 416 form guard rings, which can correspond to guard rings 208, 216 in FIG. 2, and which are located between the false collectors 410, 414 and the collector and emitter regions of NDRIFT 404 and DEEPN 420 so as to prevent surface leakage ("punch-through").

Figure 5A:
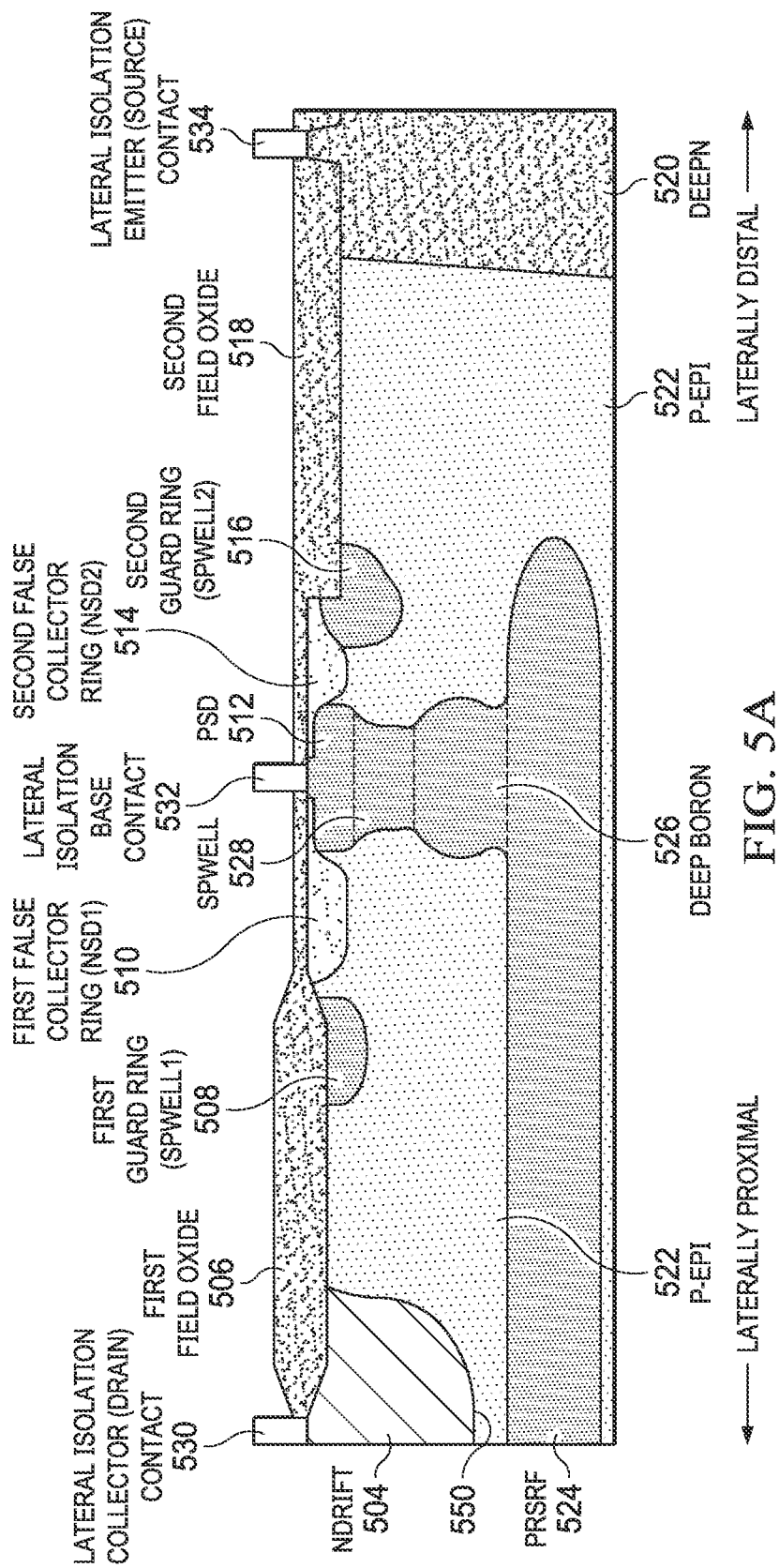
FIG. 5A is a cross-sectional view of a portion of an example lateral isolation region, corresponding to a zoomed-in view of the top portion of the cross-sectional view of FIG. 4A.
Figure 5B:
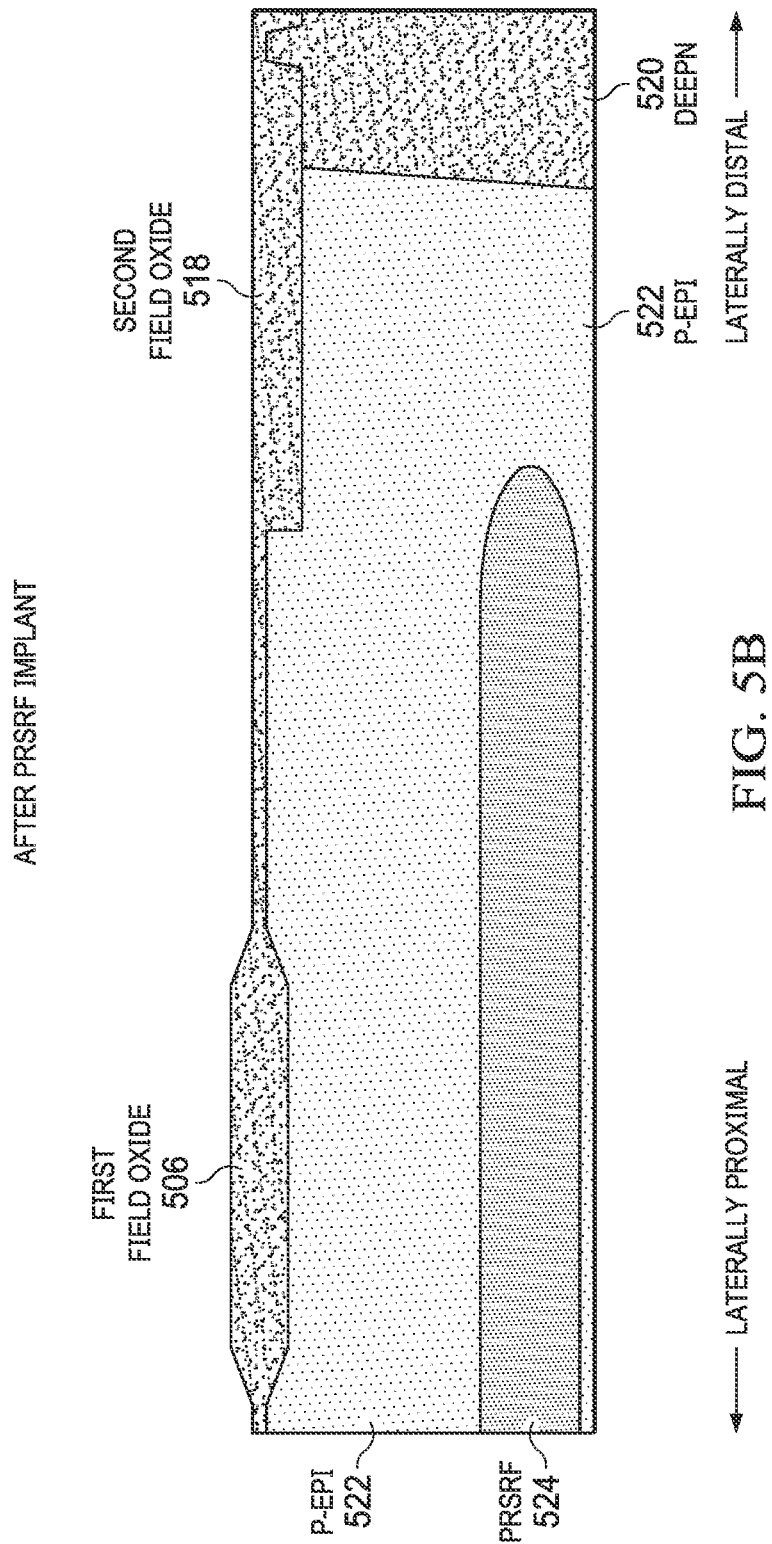
FIGS. 5B through 5G are cross-sectional views of the portion of the example lateral isolation region of FIG. 5A, showing the isolation region portion at different stages of fabrication.
Figure 5C:
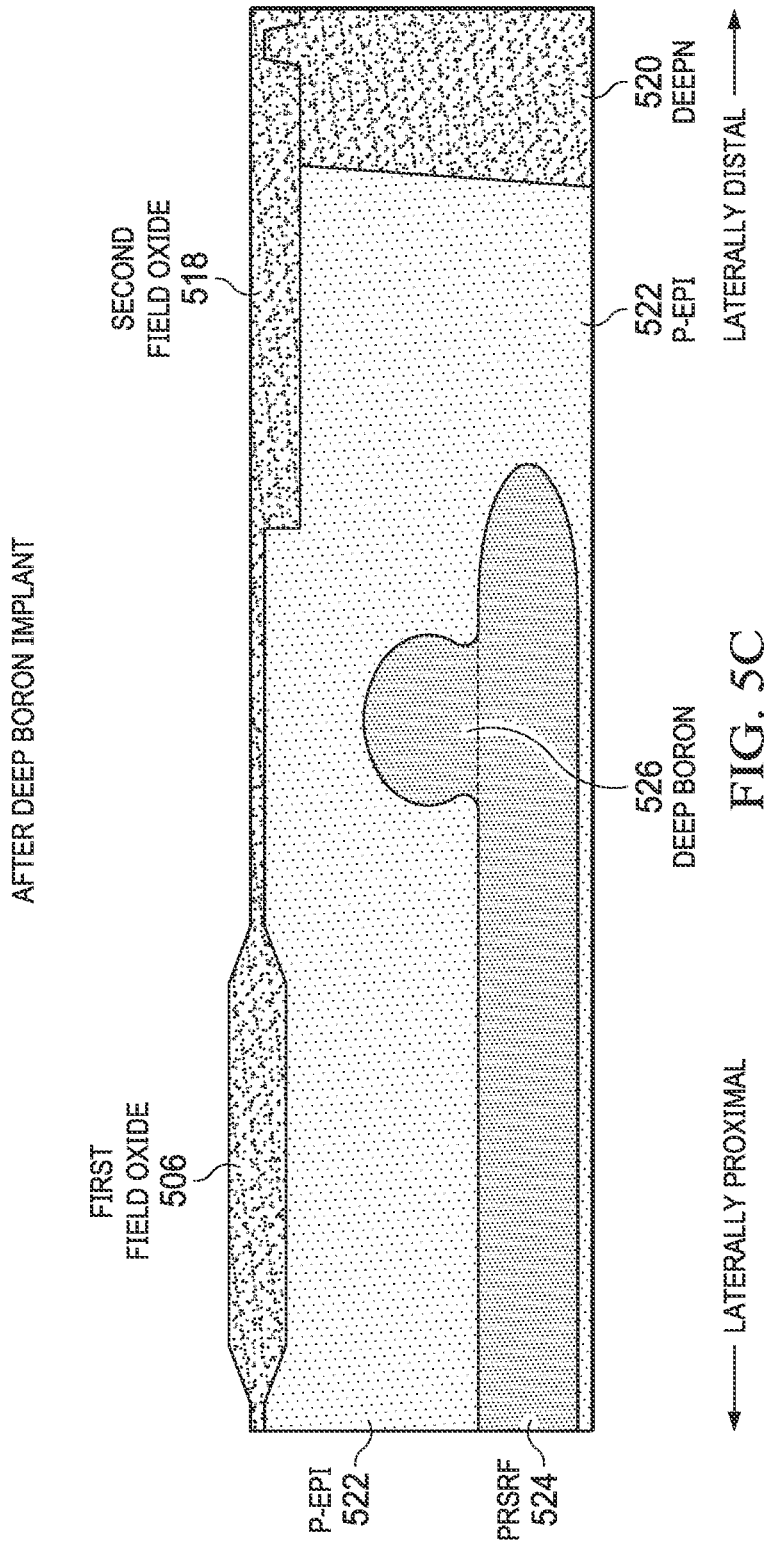
Figure 5D:
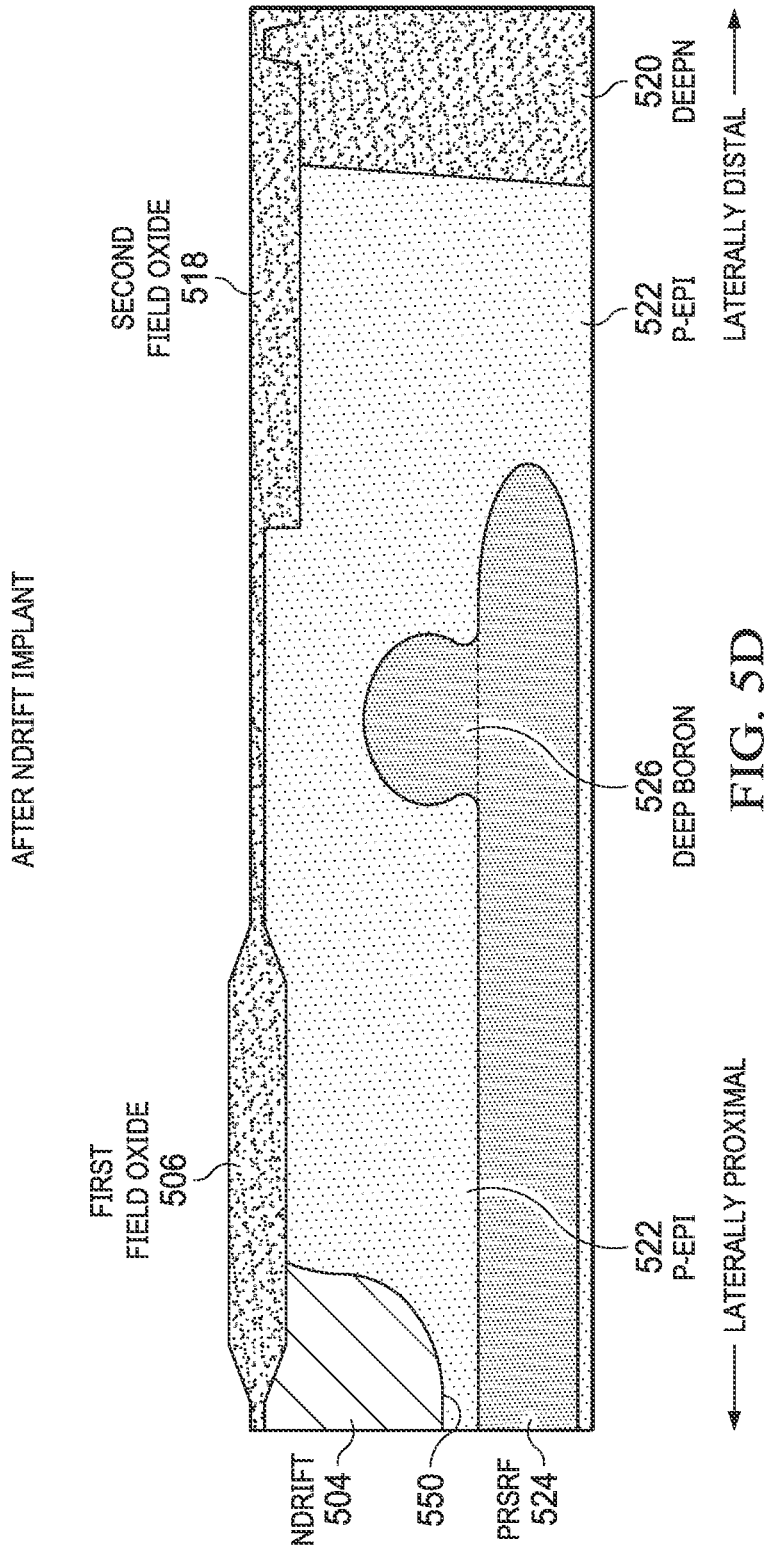
Figure 5E:
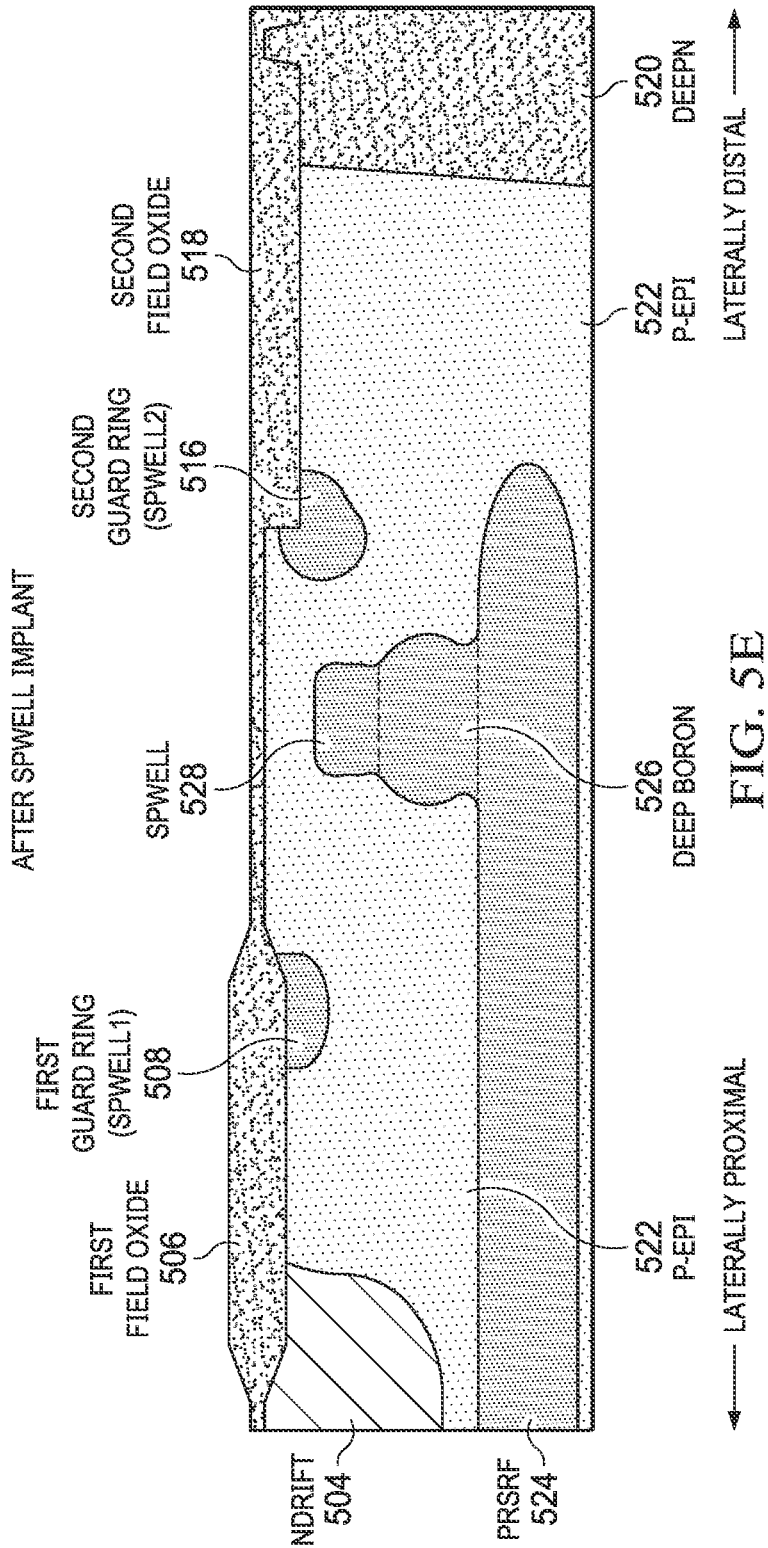
Figure 5F:
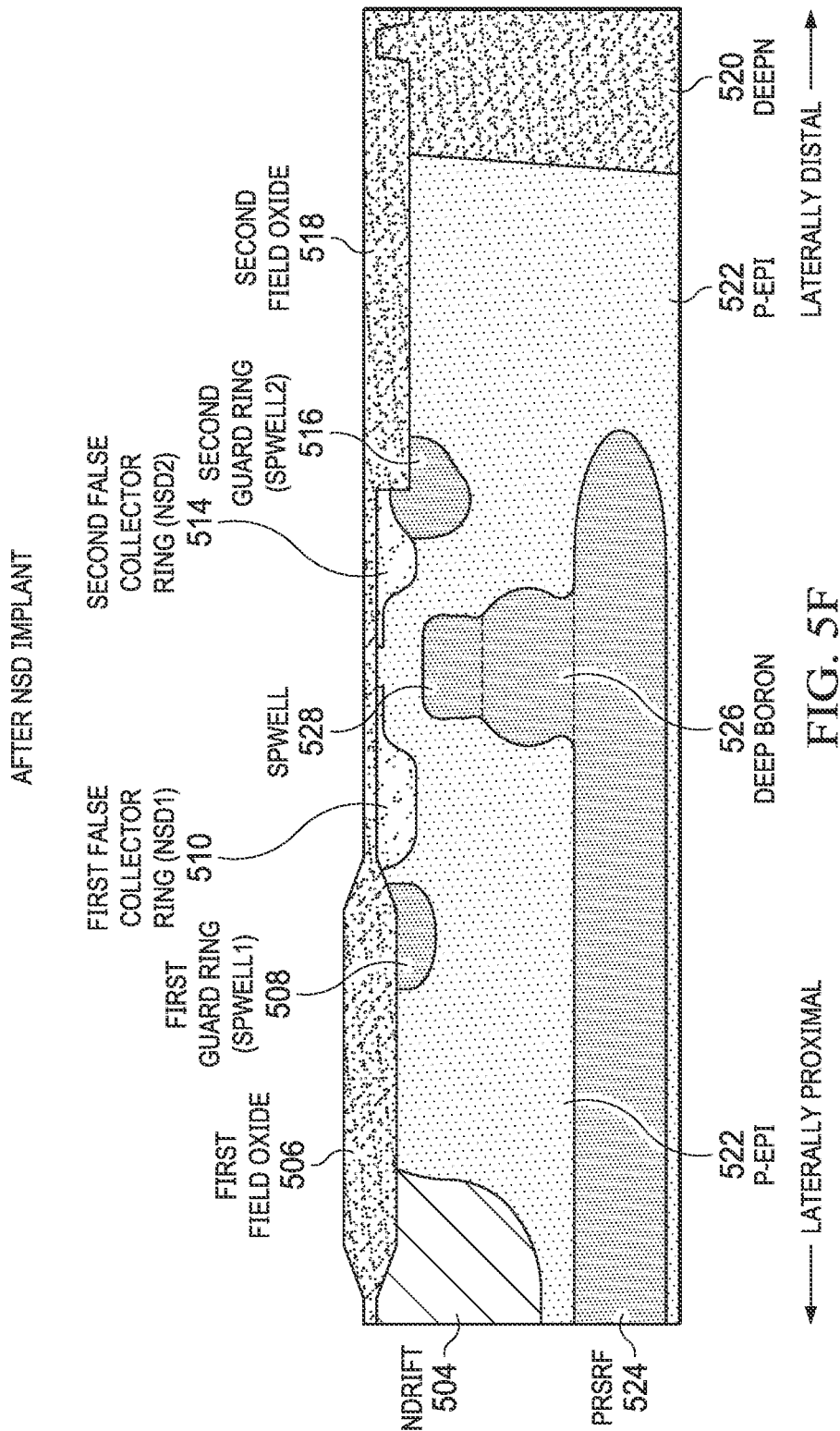
Figure 5G:
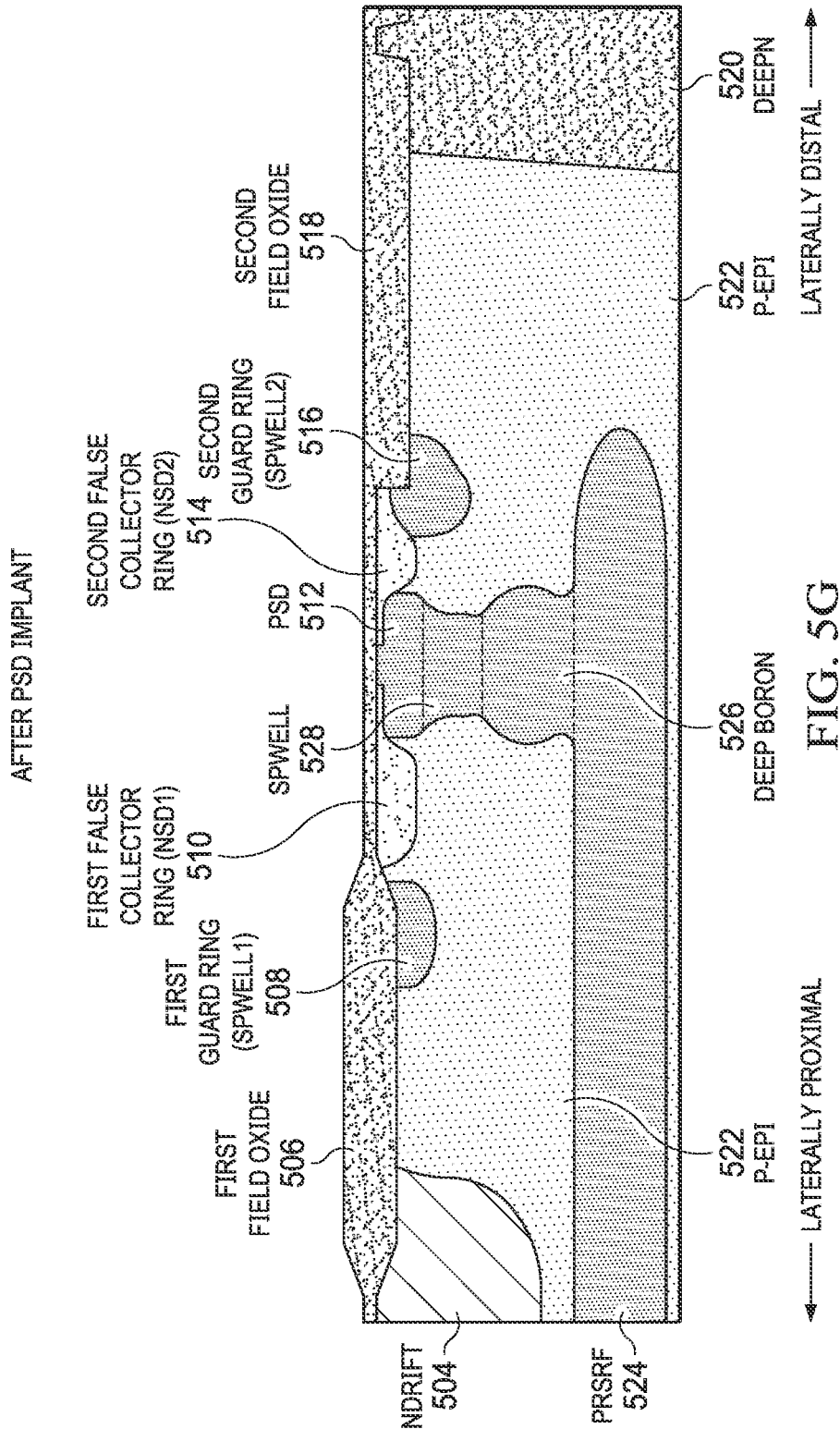
Figure 6A:
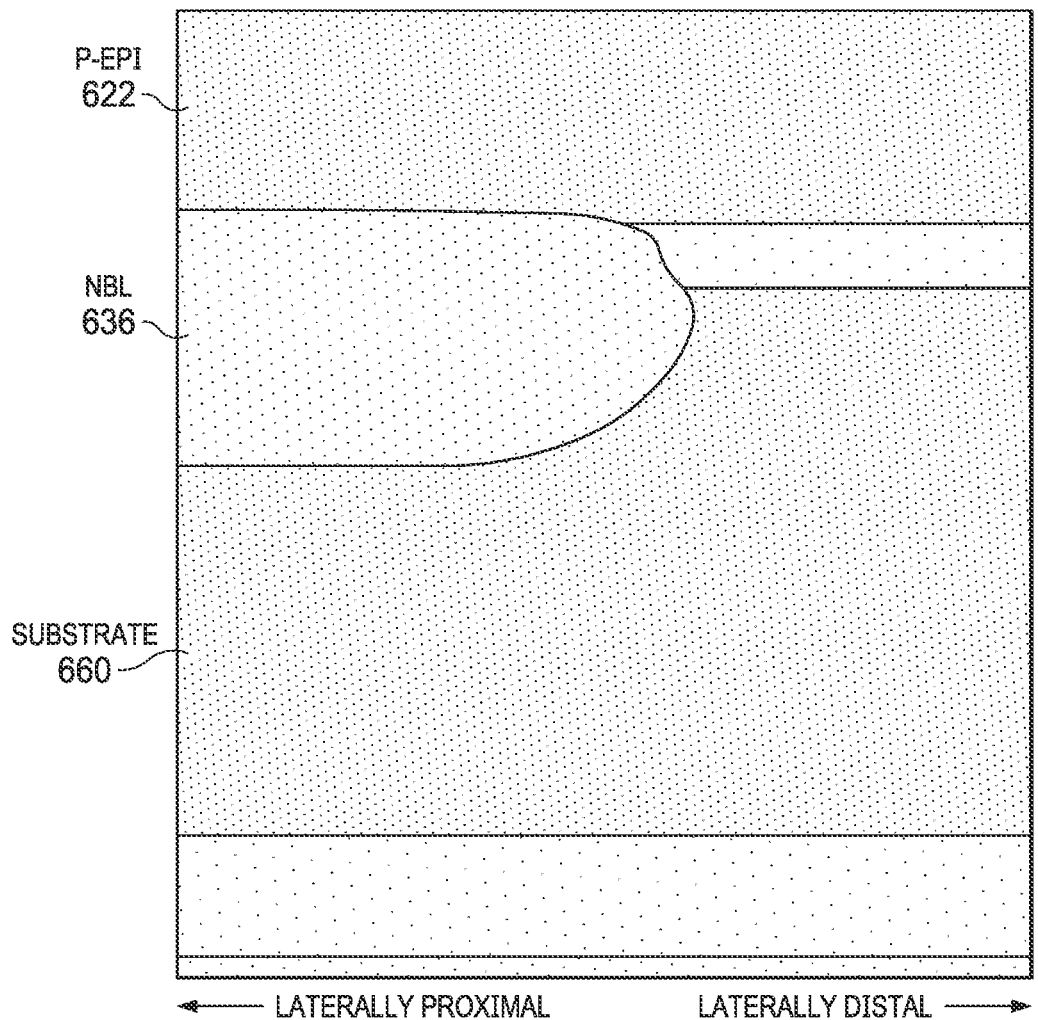
FIGS. 6A through 6D are cross sectional views of a portion of an example lateral isolation region showing formation of deep trench isolation.
Figure 6B:
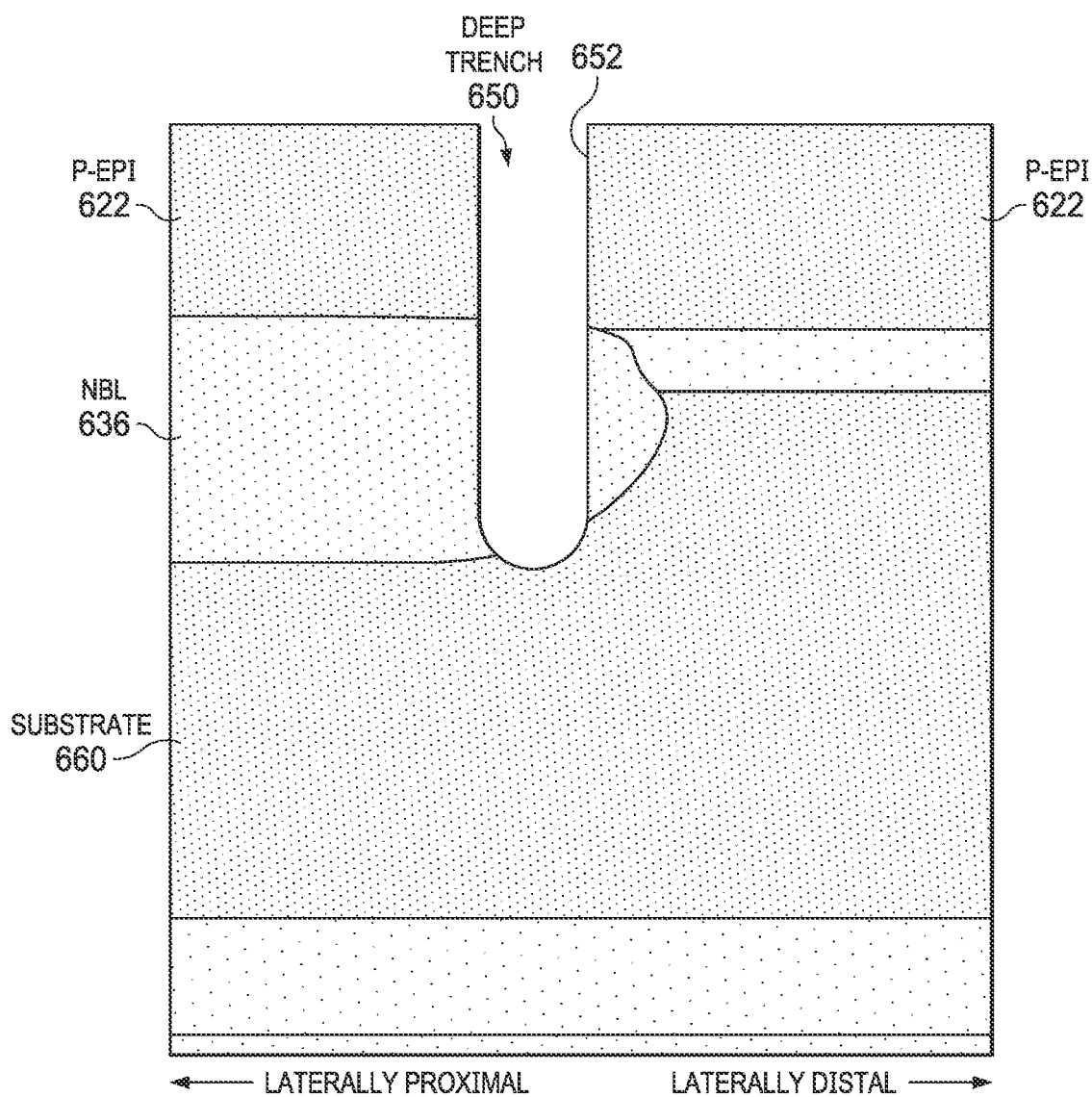
Figure 6C:
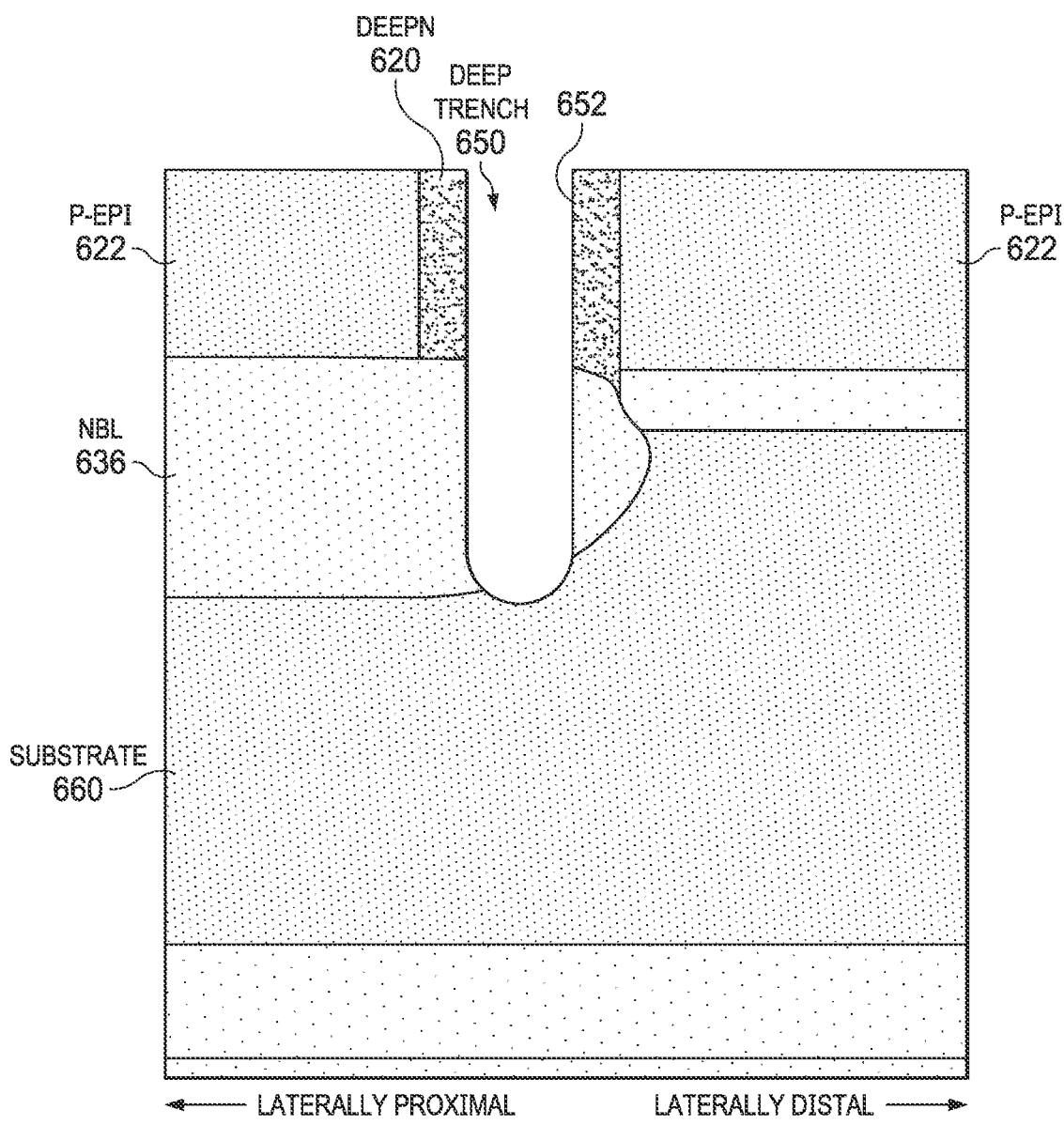
Figure 6D:
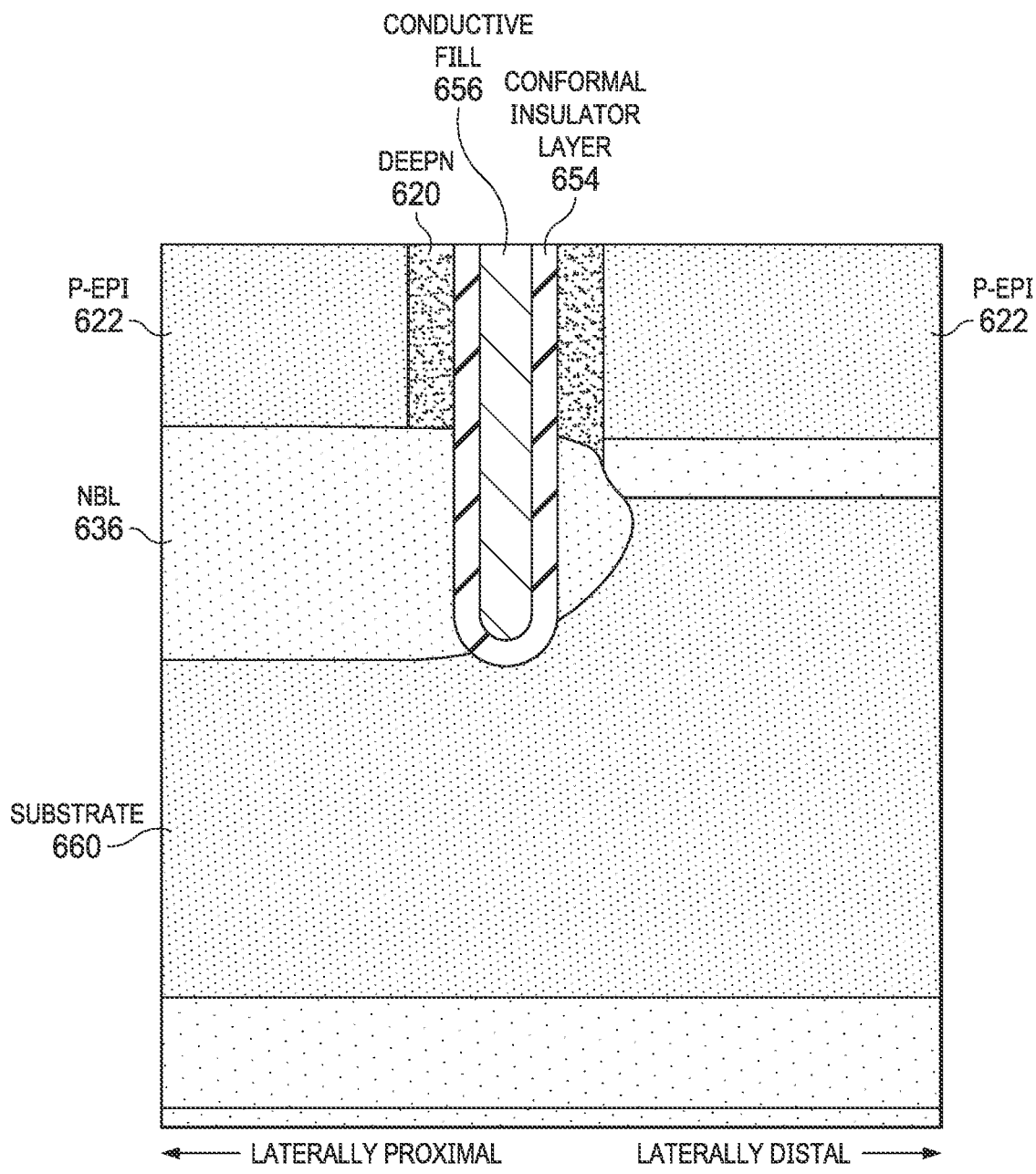

FIG. 5A is a cross-sectional view of a portion of an example lateral isolation region, corresponding to a zoomed-in view of the top portion of the cross-sectional view of FIG. 4A. N-type regions NDRIFT 504 and DEEPN 520, separated by p-type region p-epi 522, form a parasitic NPN junction. Implanted within p-epi 522 are p-type doped regions PRSRF 524 (corresponds to PBL 324 and PBL 424 of FIGS. 3 and 4, respectively), DEEP boron region 526 (which corresponding to DEEP boron 426 of FIG. 4A), SPWELL 528, and PSD 512 (corresponding to PSD 412 of FIG. 4A). Lateral isolation collector contact 530, corresponding to contact 430 of FIG. 4A, is conductively coupled to NDRIFT 504, which can correspond to n-type ring 204 in the schematic diagram of FIG. 2. Lateral isolation base contact 532, corresponding to contact 432 in FIG. 4A, is conductively coupled to PSD 512, which can correspond to PSD 212 of FIG. 2. Lateral isolation emitter contact 534, corresponding to contact 434 in FIG. 4A, is conductively coupled to DEEPN 520, which can correspond to DEEPN 220 of FIG. 2 and DEEPN 420 of FIG. 4A.

The top surface of the lateral isolation region shown in FIG. 5A is coated with a field oxide layer that includes first and second field oxide regions 506, 518, which can respectively correspond to field oxide rings 206, 218 in the schematic diagram of FIG. 2. First and second n-type false collectors 510, 514, which can correspond to NSD1 210 and NSD2 214 of FIG. 2, are located so as to collect a significant portion of injected carriers (e.g., electrons) that otherwise would reach NDRIFT 504 (the parasitic bipolar junction collector) from PSD 512 (the parasitic bipolar junction base), thus lowering the common emitter mode current gain $H_{fe}$ of the parasitic bipolar junction formed by NDRIFT 504, PSD 512, and DEEPN 520. First and second SPWELL regions 508, 516 form guard rings, which can correspond to guard rings 208, 216 in FIG. 2, and which are located between the false collectors 510, 514 and the collector and emitter regions of NDRIFT 504 and DEEPN 520 so as to prevent surface leakage ("punch-through").

In providing electrical isolation between n-type regions NDRIFT 504 and DEEPN 520, a comparatively high voltage may be applied at collector contact 530 coupled to NDRIFT 504, the emitter contact 534 coupled to DEEPN 520 may be grounded, and the base contact 532 coupled to the p-type region PSD 512 may be left floating. Under a different condition in which the p-type region PSD 512 is grounded, the maximum applied voltage at the collector 530 is limited by the junction pinch-through voltage $BV_{CES}$ at the interface 550 between NDRIFT 504 and p-epi 522. When the base 532 is left floating, however, first and second false collectors 510, 514 can be effective to improve (increase) the open-base collector-emitter breakdown voltage $BV_{CEO}$ of the parasitic bipolar when shorted-base collector-emitter breakdown voltage $BV_{CES}$ is fixed. The false collectors 510, 514 can do so by providing additional NPN junctions that collect injected current that otherwise would go through the high-electric-field region between PSD 512 and NDRIFT 504, thus reducing positive feedback that promotes avalanche breakdown. For example, inclusion of the false collectors 510, 514 in a lateral isolation region can be effective in increasing the open-base collector-emitter breakdown voltage $BV_{CEO}$ by between about 15 and 20 percent as compared to isolation arrangements that omit false collectors, at an expense of between about 1.0 and 1.5 micrometers of isolation region width needed to allocate two NSD regions to serve as false collectors. The isolation region shown in FIG. 5A with false collectors 510, 514 and guard rings 508, 516 can be used, for example, to provide lateral isolation for an LDMOS transistor. False collectors (and, in some examples, guard rings) as described above can be provided as layout features with potentially no changes required in the fabrication process flow of the larger integrated circuit. The inclusion of false collectors (and, in some examples, guard rings) also does not preclude the use of, and can thus be combined with, other measures to increase open-base collector-emitter breakdown voltage $BV_{CEO}$ of a lateral isolation region, such as isolation region size increase (when shorted-base collector-emitter breakdown voltage $BV_{CES}$ is limited by separation), introduction of grading n-type implants (when shorted-base collector-emitter breakdown voltage $BV_{CES}$ is limited by abruptness of n-type profile), and/or addition of a deep, highly doped p-type region (to increase common emitter mode current gain $H_{fe}$).

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. Modifications are possible in the described embodiments, and other embodiments are possible, within the scope of the claims.

What is claimed is:

1. A method of manufacturing an integrated circuit, the method comprising:
   forming first and second false collector regions of a first conductivity type adjacent to a surface of an epitaxial layer of semiconductor material,
   the first false collector region being located laterally on a first side of a base region, the base region formed within the epitaxial layer and having a second conductivity type,
   the second false collector region being located laterally on a second side of the base region, the second side being opposite the first side of the base region, and
   the base region being a base of a parasitic bipolar junction in an isolation region of a semiconductor device.

2. The method of claim 1, further comprising:
   forming first and second guard regions of the second conductivity type adjacent to the surface of the epitaxial layer, wherein:
   the first guard region is located laterally from the first false collector region so the first false collector region is located between the first guard region and the base region; and
   the second guard region is located laterally from the second false collector region so the second false collector region is located between the second guard region and the base region.

3. The method of claim 1, wherein the first conductivity type is n-type, and the second conductivity type is p-type.

4. The method of claim 3, wherein the first conductivity type comprises arsenic or phosphorus dopant, and the second conductivity type comprises boron dopant.

5. The method of claim 4, wherein the first and second false collector regions have a dopant concentration of between about $1 \times 10^{19}$ ions/cm$^3$ and about $1 \times 10^{20}$ ions/cm$^3$.

6. The method of claim 1, wherein the epitaxial layer is of the second conductivity type.

7. The method of claim 1, wherein prior to forming the epitaxial layer, the method further comprises:
   forming a deep trench isolation sidewall and doping the deep trench isolation sidewall to be the first conductivity type so the deep trench isolation sidewall forms an emitter of the parasitic bipolar junction.

8. The method of claim 7, further forming a collector region of the first conductivity type adjacent to the surface of the epitaxial layer, the collector region being a collector of the parasitic bipolar junction.

9. The method of claim 1, further comprising:
   forming first and second field oxide regions in the epitaxial layer, wherein:
   the first field oxide region is located between the first false collector region and a collector region of the parasitic bipolar junction; and
   the second field oxide region is located between the second false collector region and an emitter region of the parasitic bipolar junction.

10. The method of claim 1, further comprising:
    implanting dopant of the second conductivity type into the epitaxial layer to form a buried layer; and
    connecting the buried layer to the base region.

11. The method of claim 1, wherein the isolation region at least partially surrounds the semiconductor device.

12. The method of claim 1, wherein the semiconductor device includes a lateral-diffused metal-oxide-semiconductor (LDMOS) transistor, a diode, or a bipolar transistor.

13. A method of fabricating an integrated circuit, comprising:
    implanting dopant of a first conductivity type into a semiconductor substrate to form a first buried layer;
    forming an epitaxial layer of a second conductivity type on the semiconductor substrate over the first buried layer, the second conductivity type being opposite the first conductivity type;
    forming a deep trench isolation sidewall of the first conductivity type over the semiconductor substrate;
    forming an oxide layer over the epitaxial layer;
    implanting dopant of the second conductivity type into the epitaxial layer to form a second buried layer;
    implanting dopant of the second conductivity type into the epitaxial layer above the second buried layer to form a deep region that is adjacent to the second buried layer and between the oxide layer and the second buried layer;
    implanting dopant of the first conductivity type into the epitaxial layer above the second buried layer to form a collector region, the collector region located laterally from the deep region and extending from a surface of the epitaxial layer to terminate at a location spaced from the second buried layer;
    implanting dopant of the second conductivity type into the epitaxial layer above the second buried layer to form first, second, and third shallow well regions, the third shallow well region located laterally between the first and second shallow well regions, the third shallow well region formed over the deep region;
    implanting dopant of the first conductivity type into the epitaxial layer to form first and second false collector regions adjacent to the surface of the epitaxial layer, the first false collector region being located laterally between the first shallow well region and the third shallow well region, and the second false collector region being located laterally between the third shallow well region and the second shallow well region; and implanting dopant of the second conductivity type into the epitaxial layer to form a base region extending between the third shallow well region and the surface of the epitaxial layer, the base region forming a base of a bipolar junction of a lateral isolation region, the collector region forming a collector of the bipolar junction, and the deep trench isolation sidewall forming an emitter of the bipolar junction.

14. The method of claim 13, wherein the first and second false collector regions are doped with arsenic or phosphorus.

15. The method of claim 14, wherein the dopant of the first conductivity type in the first and second false collector regions has a concentration of between about $1\times10^{19}$ ions/cm$^3$ and about $1\times10^{20}$ ions/cm$^3$.

16. The method of claim 13, wherein the first and second shallow well regions are doped with boron.

17. The method of claim 16, wherein the dopant of the second conductivity type in the first and second shallow well regions has a concentration of between about $1\times10^{16}$ ions/cm$^3$ and about $1\times10^{18}$ ions/cm$^3$.

18. A method, comprising:

forming a trench isolation sidewall of a first conductivity type in a semiconductor layer of a second conductivity type, wherein the trench isolation sidewall forms an emitter of a bipolar junction of an isolation region;

implanting dopant of the first conductivity type into the semiconductor layer to form a collector region located laterally away from the trench isolation sidewall, wherein the collector region forms a collector of the bipolar junction;

implanting dopant of the first conductivity type into the semiconductor layer to form first and second false collector regions, the first and second false collector regions being separated from each other and located laterally between the collector region and the trench isolation sidewall, wherein the first false collector region is located laterally closer to the collector region than the second false collector region; and implanting dopant of the second conductivity type into the semiconductor layer to form a base region that forms a base of the bipolar junction, wherein the base region is located between the first and second false collector regions.

19. The method of claim 18, further comprising:

implanting dopant of the second conductivity type into the semiconductor layer to form first and second guard ring regions, wherein:

the first guard ring region is located between the collector region and the first false collector region; and the second guard ring region is located between the second false collector region and the trench isolation sidewall.

20. The method of claim 18, further comprising:

forming first and second field oxide regions in the semiconductor layer, wherein:

the first field oxide region is located between the collector region and the first false collector region; and the second field oxide region is located between the second false collector region and the trench isolation sidewall.

21. The method of claim 18, further comprising:

implanting dopant of the second conductivity type into the semiconductor layer to form a buried layer; and connecting the buried layer to the base region.

22. The method of claim 18, wherein the isolation region at least partially surrounds a semiconductor device.

23. The method of claim 22, wherein the semiconductor device includes a lateral-diffused metal-oxide-semiconductor (LDMOS) transistor, a diode, or a bipolar transistor.

* * * * *